(12) United States Patent
Su et al.

(10) Patent No.: US 11,862,558 B2
(45) Date of Patent: Jan. 2, 2024

(54) 3D NAND MEMORY DEVICE AND METHOD OF FORMING THE SAME

(71) Applicant: Yangtze Memory Technologies Co., Ltd., Hubei (CN)

(72) Inventors: Rui Su, Wuhan (CN); Zhongwang Sun, Wuhan (CN); Wenxi Zhou, Wuhan (CN); Zhiliang Xia, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 588 days.

(21) Appl. No.: 17/113,519

(22) Filed: Dec. 7, 2020

(65) Prior Publication Data
US 2021/0265268 A1    Aug. 26, 2021

Related U.S. Application Data

(63) Continuation of application No. PCT/CN2020/076509, filed on Feb. 25, 2020.

(51) Int. Cl.
| | |
|---|---|
| *H01L 23/528* | (2006.01) |
| *H01L 21/768* | (2006.01) |
| *H01L 23/522* | (2006.01) |
| *H10B 41/10* | (2023.01) |
| *H10B 41/27* | (2023.01) |

(Continued)

(52) U.S. Cl.
CPC .... *H01L 23/5283* (2013.01); *H01L 21/76816* (2013.01); *H01L 21/76877* (2013.01); *H01L 23/5226* (2013.01); *H10B 41/10* (2023.02); *H10B 41/27* (2023.02); *H10B 43/10* (2023.02); *H10B 43/27* (2023.02)

(58) Field of Classification Search
CPC ........... H01L 23/5283; H01L 21/76816; H01L 21/76877; H01L 23/5226; H10B 41/10; H10B 41/27; H10B 43/10; H10B 43/27; H10B 43/50; H10B 43/35; H10B 43/40
See application file for complete search history.

(56) References Cited

U.S. PATENT DOCUMENTS

| | | | |
|---|---|---|---|
| 2016/0276264 A1* | 9/2016 | Noda | ..................... H10B 43/27 |
| 2017/0200676 A1 | 7/2017 | Jeong et al. | |

(Continued)

FOREIGN PATENT DOCUMENTS

TW    202034499 A    9/2020

*Primary Examiner* — Yasser A Abdelaziez
(74) *Attorney, Agent, or Firm* — Oblon, McClelland, Maier & Neustadt, L.L.P.

(57) ABSTRACT

A semiconductor device is provided. The semiconductor device includes a substrate, a stack of word line layers and insulating layers that are stacked alternatingly over the substrate, and channel structures formed in a first array region and a second array region of the stack. The first array region and the second array region are positioned at opposing sides of the stack. A first staircase is formed in a connection region of the stack over the substrate. The connection region is arranged between the first and second array regions and the first staircase has non-quadrilateral treads. A second staircase is formed in the connection region of the stack over the substrate and the second staircase has non-quadrilateral treads. The connection region in the stack includes a separation region between the first and second staircases.

20 Claims, 15 Drawing Sheets

(51) Int. Cl.
    *H10B 43/10*     (2023.01)
    *H10B 43/27*     (2023.01)

(56) References Cited

U.S. PATENT DOCUMENTS

| | | | |
|---|---|---|---|
| 2018/0053686 A1* | 2/2018 | Hyun | H10B 43/50 |
| 2018/0247955 A1 | 8/2018 | Iida et al. | |
| 2018/0286743 A1 | 10/2018 | Chang | |
| 2018/0350825 A1 | 12/2018 | Ogawa et al. | |
| 2022/0181141 A1* | 6/2022 | van Schravendijk | H10B 43/20 |

* cited by examiner

3D NAND MEMORY DEVICE AND METHOD OF FORMING THE SAME

RELATED APPLICATION

This application is a bypass continuation of International Application No. PCT/CN2020/076509, filed on Feb. 25, 2020. The entire disclosure of the prior application is hereby incorporated by reference in its entirety.

BACKGROUND

Flash memory devices have recently been undergoing rapid development. Flash memory devices are able to retain stored data for a long period of time without applying a voltage. Further, the reading rate of flash memory devices can be relatively high, and it is easy to erase stored data and rewrite data into the flash memory devices. Thus, flash memory devices have been widely used in micro-computers, automatic control systems, etc. To increase the bit density and reduce the bit cost of flash memory devices, three-dimensional (3D) NAND (Not AND) flash memory devices are being developed.

SUMMARY

According to an aspect of the disclosure there is provided a semiconductor device. The semiconductor device can include a substrate, a stack of word line layers and insulating layers that are stacked alternatingly over the substrate, and channel structures formed in a first array region and a second array region of the stack. The first and second array regions are positioned at opposing sides of the stack. A first staircase is formed in a connection region of the stack over the substrate. The connection region is arranged between the first and second array regions. The first staircase has non-quadrilateral treads. A second staircase is formed in the connection region of the stack over the substrate, and the second staircase has non-quadrilateral treads. The connection region in the stack includes a separation region between the first and second staircases.

In some embodiments, the non-quadrilateral treads are triangular.

In some embodiments, the first staircase can have a first group of stairs (or first stairs) with a first step-down direction, and a second group of stairs (or second stairs) with a second step-down direction. The first step-down direction is opposite to the second step-down direction, and the first group of stairs and the second group of stairs converge at a first shared stair. In addition, the second staircase can have a third group of stairs (also referred to as third stairs) with the first step-down direction, and a fourth group of stairs (also referred to as fourth stairs) with the second step-down direction so that the third group of stairs and the fourth group of stairs converge at a second shared stair.

In some embodiments, the first group of stairs and the second group of stairs in the first staircase can have a third step-down direction. The third and fourth groups of stairs in the second staircase can have a fourth step-down direction that is opposite to the third step-down direction.

In some embodiments, each stair in the first staircase can have a smaller height than a height of a stair in the second staircase on an opposite side of the separation region. An uppermost stair in the second staircase and the separation region can have a same height.

In some embodiments, the semiconductor device can also include first contact structures that are formed on the first staircase and connected to the word line layers in the first staircase. The semiconductor device can have second contact structures formed on the second staircase and connected to the word line layers in the second staircase.

According to another aspect of the disclosure, a method for fabricating a semiconductor device is provided. An initial stack of sacrificial word line layers and insulating layers is formed over a substrate of the semiconductor device. The sacrificial word line layers and the insulating layers are disposed over the substrate alternately. A first staircase is formed in a first staircase region of a connection region of the initial stack, where the first staircase has non-quadrilateral treads. A second staircase is formed in a second staircase region of the connection region of the initial stack, where the second staircase has non-quadrilateral treads. The connection region of the initial stack includes a separation region between the first and second staircases, and the connection region is positioned between array regions of the initial stack at opposing sides of the initial stack.

In some embodiments, in order to form the first staircase, one or more of the sacrificial word line layers and the insulating layers can be removed in the first staircase region of the connection region. Further, at least one of the sacrificial word line layers and the insulating layers in the first staircase region can be shaped to form a first stair having a tread with a first edge profile and a first step-down direction. The first stair divides the first staircase region into a first section and a second section. At least one of the sacrificial word line layers and the insulating layers can be subsequently shaped in the first staircase region to form stairs with a second step-down direction. A first patterning process can be performed sequentially on the sacrificial word line layers and the insulating layers in the first staircase region to form the first staircase in the first staircase region.

In some embodiments, in order to form the second staircase, at least one of the sacrificial word line layers and the insulating layers can be shaped in the second staircase region of the connection region to form a second stair. The second stair has a tread with the first edge profile and the first step-down direction. The second stair divides the second staircase region into a third section and a fourth section. At least one of the sacrificial word line layers and the insulating layers can be shaped in the second staircase region to form stairs with a third step-down direction that is opposite to the second step-down direction. Subsequently, a second patterning process can be performed sequentially on the sacrificial word line layers and the insulating layers in the second staircase region to form the second staircase in the second staircase region.

In some embodiments, performing the first patterning process includes performing the first patterning process repetitively on the sacrificial word line layers and the insulating layers in the first staircase region to form stairs having the first edge profile in the first section with a fourth step-down direction, and stairs having the first edge profile in the second section with the first step-down direction. The fourth step-down direction is opposite to the first step-down direction. Further, the performing the first patterning process includes performing the first patterning process repetitively on the sacrificial word line layers and the insulating layers in the first staircase region to form stairs having a second edge profile in the first section with the fourth step-down direction, and stairs having the second edge profile in the second section with the first step-down direction, where the first edge profile and the second edge profile are symmetric.

In some embodiments, performing the second patterning process includes performing the second patterning process repetitively on the sacrificial word line layers and the insulating layers in the second staircase region to form stairs having the first edge profile in the third section with the fourth step-down direction, and stairs having the first edge profile in the fourth section with the first step-down direction. Further, the performing the second patterning process includes performing the second patterning process repetitively on the sacrificial word line layers and the insulating layers in the second staircase region to form stairs having the second edge profile in the third section with the fourth step-down direction, and stairs having the second edge profile in the fourth section with the first step-down direction.

In some embodiments, the first edge profile and the second edge profile are symmetric along a direction parallel to the second step-down direction or the third step-down direction.

In some embodiments, the first patterning process and the second patterning process include at least one of a trim-etch process or a photolithography-etch (also referred to as photo-etch) process. In some embodiments, the first edge profile is a zig-zag edge profile or a slant edge profile.

The first staircase can include first stairs and second stairs. The first stairs have non-quadrilateral treads and extend in the fourth step-down direction in the first section. The second stairs have non-quadrilateral treads and extend in the first step-down direction in the second section. The first stairs and the second stairs can converge at a first shared stair, and the fourth step-down direction is opposite to the first step-down direction. The second staircase can have third stairs and fourth stairs. The third stairs can have non-quadrilateral treads and extend in the fourth step-down direction in the third section, and the fourth stairs can have non-quadrilateral treads and extend in the first step-down direction in the fourth section. The third stairs and the fourth stairs can converge at a second shared stair.

In some embodiments, the first stairs and the second stairs can further have the second step-down direction. The third stairs and the fourth stairs can further have the third step-down direction. The second step-down direction is opposite to the third step-down direction.

In some embodiments, each stair in the first staircase can have a smaller height than a height of a stair in the second staircase on an opposite side of the separation region.

In the disclosed method, channel structures can be subsequently formed in the array regions of the initial stack, where the channel structures extend from the substrate and extend through the sacrificial word line layers and the insulating layers in the array regions of the initial stack. The sacrificial word line layers can then be replaced with word line layers that are made of a conductive material. Further, first contact structures on the first staircase, and second contact structures on the second can be formed. The first contact structures are connected to the word line layers in the first staircase, and the second contact structures are connected to the word line layers in the second staircase.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1:
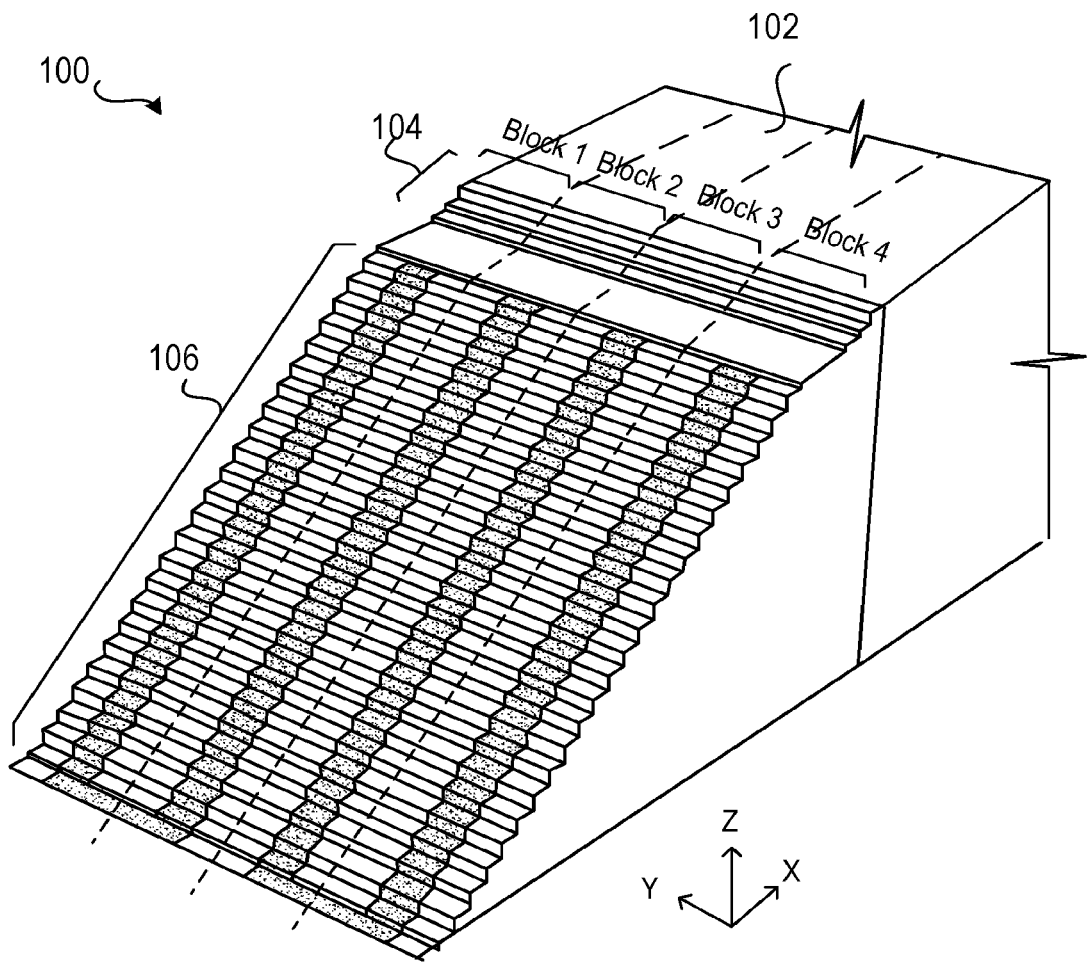
FIG. 1 is a three-dimensional view of a 3D NAND device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A 3D NAND device can include an array region and one or more connection regions positioned at boundaries of the array region. The array region can include a plurality of channel structures that extend through a plurality of word line layers stacked over a substrate of the device. The word line layers can further laterally extend to the connection region with a stair-cased/step-shaped configuration. A plurality of contact structures can be connected to the word line layers in the connection region and further coupled to external control signals. As 3D NAND devices move to higher capacity and density, especially from a 64 layer (64L) to 128 layer (128L) architecture, forming the stair-cased configuration of the connection region becomes an increasingly time-consuming process.

The present disclosure includes embodiments directed to staircase configurations in a 3D NAND device. A staircase configuration can include a stair-cased connection region that is arranged between two array regions of the 3D NAND device, where the two array regions are formed at two opposing sides of the 3D NAND device. The staircase configuration can not only enhance word line controls but also simplify a manufacturing process and reduce or minimize mask layers, for example, by combining a chop process and a stair divided scheme during the manufacturing process. In addition, the stair-cased connection region includes stairs with non-quadrilateral treads, which can improve the density of contact structures that are formed on the stairs.

FIG. 1 is a three-dimensional view of a 3D NAND device (or device) 100. As shown in FIG. 1, the device 100 can include a stack of word line layers and insulating layers that are arranged alternately over a substrate (not shown). The stack can have an array region 102, where a plurality of channel structures (not shown) can extend from the substrate and extend through the word line layers and insulating layers in the array region 102. The stack can also have a connection region that is formed with a stair-cased configuration and positioned at a side of the array region 102. The connection region can have a first stair-cased portion 104 that is connected to one or more bottom select gates of the device 100. The connection region can also have a second stair-cased portion 106 that is connected to the channel structures in the array region 102 to form an array of memory cells. In an exemplary embodiment of FIG. 1, the device 100 can have four blocks, where each of the four blocks can have one or more sub-blocks (also referred to as fingers, or finger structures).

Figure 2:
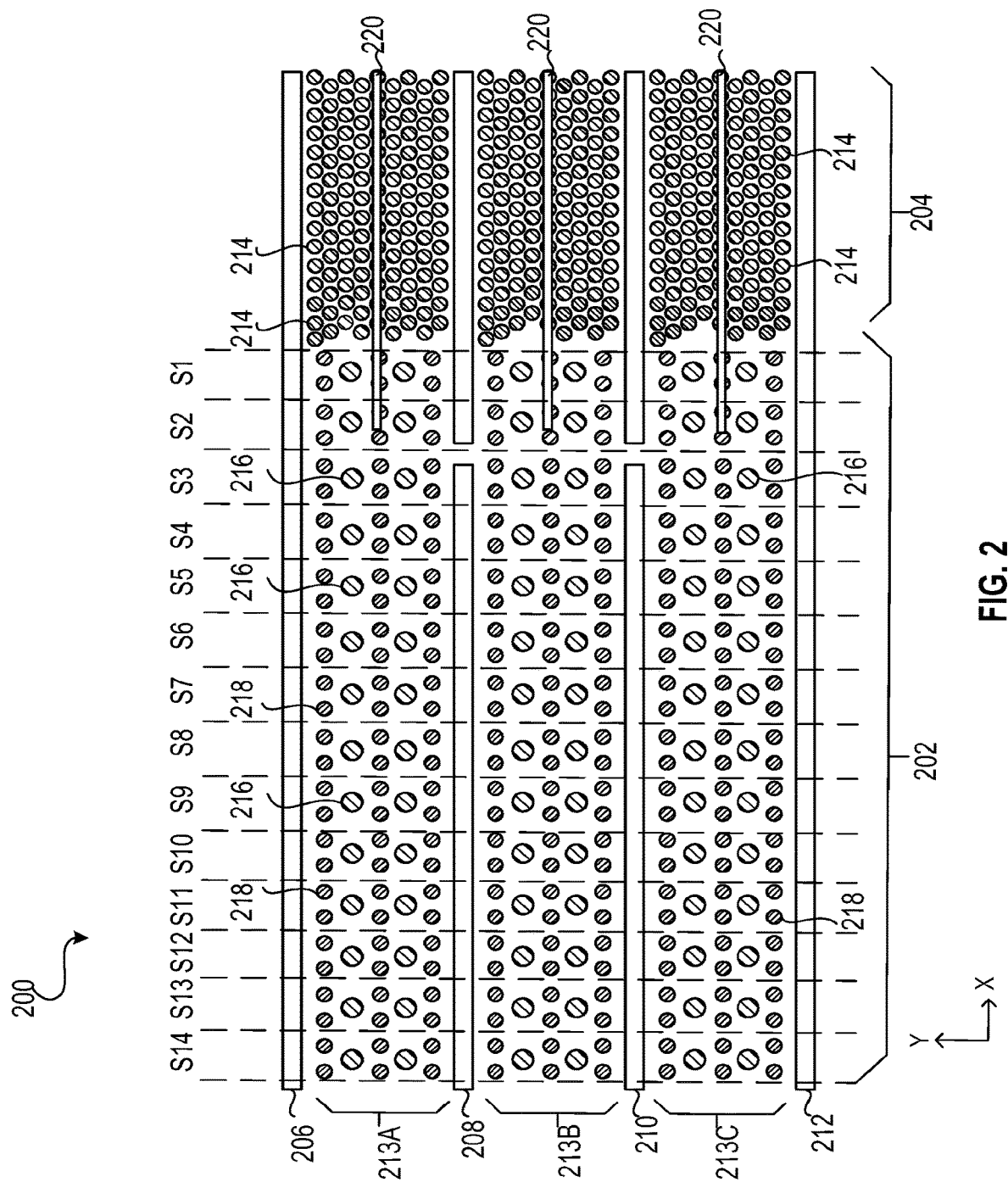
FIG. 2 is a top down view of the 3D NAND device illustrated in FIG. 1.

FIG. 2 is a top down view of a block 200 in the 3D NAND device 100. The block 200 can have a connection region (also referred to as staircase region) 202 and an array region 204. The connection region 202 is positioned at a first side of the array region 204. In some embodiments, another connection region (not shown) can be positioned at a second side of the array region 204. For example, the second side is opposite to the first side. The block 200 can have slit structures (also referred to gate line slits) 206, 208, 210, 212 that divide the block 200 into three sub-blocks (or finger structures) 213A-213C. The slit structures (e.g., 206 and 212) can be positioned at top and bottom boundaries of the block and have a continuous shape. The slit structures (e.g., 208, 210) can be disposed within the block 200 and have a discontinuous shape. In some embodiments, a gate-last fabrication technology is used to form the 3D NAND device 100. Thus the slit structures are formed to assist in the removal of sacrificial word line layers, and the formation of the real gates. In some embodiments, the slit structures can be made of conductive materials and positioned on array common source (ACS) regions to serve as contacts, where the ACS regions are formed in the substrate to serve as common sources. In some embodiments, the slit structures can be made of dielectric materials to serve as separation structures.

The connection region 202 can have a plurality of stairs. For example, 14 stairs S1-S14 are included in the connection region 202 of FIG. 2 with a step-down direction along the −X direction. The connection region 202 can have a plurality of dummy channel structures 218. The dummy channel structures 218 can be disposed at suitable places for process variation control during fabrication and/or for additional mechanical support. The connection region 202 can also have a plurality contact structures 216 that are positioned on the stairs S1-S14 and connected to the word line layers. The contact structures 216 can extend from the stairs S1-S14 and further be connected to metal layers (e.g., M0 layer, M1 layer) of the backend of line (BEOL), where the metal layers are stacked over the contact structures 216.

In the array region 204, a plurality of channel structures 214 are disposed. The channel structures 214 can extend from the substrate and extend through the word line layers so as to form an array of vertical memory cell strings. Each of the vertical memory cell string can include a respective channel structure that is coupled to the word line layers to form one or more bottom select transistors (BSTs), a plurality of memory cells (MCs), and one or more top select transistors (TSTs) that are disposed sequentially and in series over the substrate. Each of the channel structures can further include a channel layer, a tunneling layer that surrounds the channel layer, a charge trapping layer that surrounds the tunneling layer, and a barrier layer that surrounds the charge trapping layer and further is in direct contact to the word line layers. In some embodiments, a high-K layer, such as $HfO_2$ or AlO, can be disposed between the word line layers and the barrier layer.

In some embodiments, one or more trenches 220, for example serving as top select gate cut (TSG-Cut) structures can be disposed in the array region 204. As shown in FIG. 2, the TSG-Cut structures 220 can be disposed in the middle of each of the finger (or sub-block) portions 213A-213C to divide a top select gate (TSG) layer of the corresponding memory finger into two portions, and thereby can divide the corresponding memory finger portion into two separately programmable (read/write) pages. While an erase operation of a 3D NAND device can be carried out at a memory block level, read and write operations can be carried out at a memory page level.

In the 3D NAND device 100, the connection region 202 can be formed by performing a resist trim process and an etching process sequentially on the word line layers and the insulating layers. As shown in FIG. 2, the connection region 202 is formed along one step-down direction (e.g., −X direction) with three or more stair divided schemes (or divided stair regions). Accordingly, the word line layers positioned at the bottom portion of the stack can have a long dimension along the step-down direction (e.g., −X direction) as the 3D NAND technology migrates to the 128L architecture, which can result in a high resistance-capacitance (RC) delay.

In the present disclosure, staircase configurations in a 3D NAND device are provided. A connection region can be arranged between array regions (e.g., two array regions) of the 3D NAND device. The array regions are formed, for example, at two opposing sides of the 3D NAND device. One or more staircases can be formed in the connection region. Each staircase can have stairs with non-quadrilateral treads extending in two or more step-down directions. The staircase configuration can not only enhance word line controls but also simplify a manufacturing process and minimize a mask request by combining a chop process and a stair divided scheme during the manufacturing process. The non-quadrilateral treads can further improve the density of the contact structures positioned on the stairs. In the present disclosure, each staircase can further include quadrilateral treads and/or treads with other profiles, according to the process flow.

Figure 3:
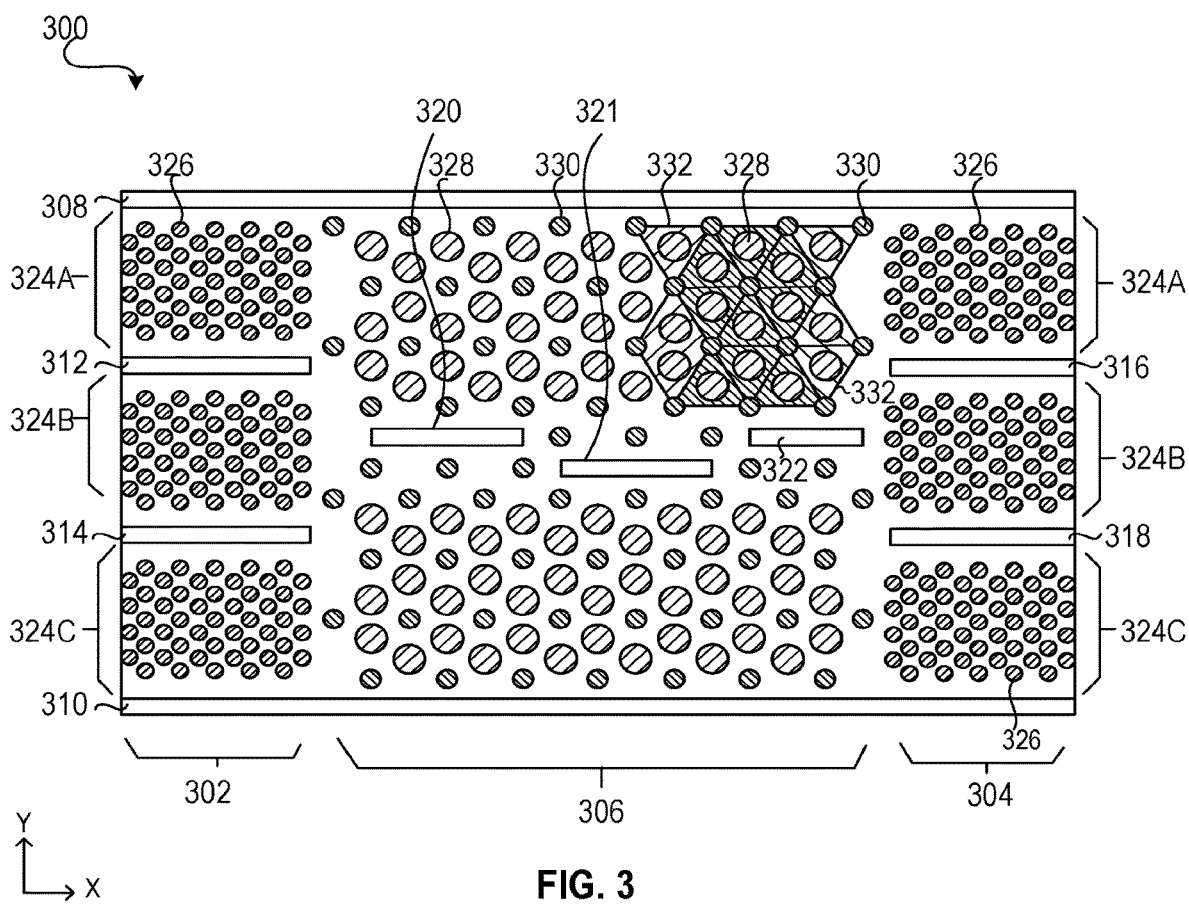
FIG. 3 is a top down view of an exemplary 3D NAND device, in accordance with exemplary embodiments of the disclosure.

FIG. 3 is a top down view of an exemplary 3D NAND device. For simplicity and clarity, FIG. 3 illustrates only one block 300 of the 3D NAND device. However, the 3D NAND device can include any number of blocks, for example, according to the circuit design. As shown in FIG. 3, the block 300 can have a stack that is formed of alternatingly disposed word line layers and insulating layers over a substrate (not shown). The block 300 can have array regions (e.g., two array regions 302 and 304) and a connection region 306. The two array regions 302 and 304 are positioned at two opposing sides of the block 300. The connection region 306 can be disposed between the two array regions 302 and 304. The block 300 can also have a plurality of slit structures (or gate line slits) 308, 310, 312, 314, 316, 318, 320, 321, and 322 that can extend from the substrate and extend through the stack formed of alternatingly disposed word line layers and insulating layers. The slit structures 308 and 310 are positioned at the top and bottom boundaries of the block 300 respectively. The slit structures 312 and 314 are disposed within the array region 302, and the slit structures 316 and 318 are disposed within the array region 304. Accordingly, the array regions 302 and 304 are divided into three sub-blocks (or fingers) 324A-324C by the slit structures 312, 314, 316, and 318. The slit structures 320-322 are positioned in the connection region 306 and can have a discontinuous configuration. In some embodiments, the slit structures 320-322 can be dummy slit structures, that is the slit structures 320-322 are not connected to any electrical inputs. In some embodiments, the slit structures (e.g., 320-322) in the connection region are not aligned with, or offset from, one or more of the slit structures (e.g., 312, 314, 316, and 318) in the array regions. The slit structures can have different configurations in other embodiments. For example, the slit structures (e.g., 320-322) in the connection region can be aligned with the slit structures (e.g., 312, 314, 316, and 318) in the array regions according to the circuit layout.

Still in FIG. 3, similar to the block 200, the array regions 302 and 304 of the block 300 can have a plurality of channel structures 326. The channel structures 326 can extend from the substrate and extend through the word line layers and the insulating layers in the array regions 302 and 304. The connection region 306 can have a plurality of contact structures 328 and a plurality of dummy channel structures 330. The contact structures 328 and dummy channel structures 330 are positioned on the word line layers and further extend from the word line layers in the connection region 306 (e.g., along a direction perpendicular to the substrate). For example, each of the plurality of contact structures 328 can be positioned on a different word line layer.

The connection region 306 further can have a plurality of stairs 332 with non-quadrilateral treads. Generally, stairs are formed of treads and risers. In an example, a tread is the part that is disposed horizontally between a top edge of a lower riser and a bottom edge of an upper riser, and a riser connects treads (e.g., the part that is disposed vertically between an inner edge of a lower tread and an outer edge of an upper tread. In some examples, a stair is composed of a tread and a lower riser of the tread. The tread is the part that can be configured into a contact pad for one or more contact structures (e.g., 328) to land on. In an example of the FIG. 3, the riser is the sidewall of a stack of layers, such as alternatingly disposed (sacrificial) word line layers and insulating layers. In the present disclosure, a height of the stair can be measured in terms of layer pairs of the word line layer and the insulating layer.

In some embodiments, the non-quadrilateral treads 332 can be triangular, where each of the treads 332 can have three vertexes. The three vertexes can be located at three dummy channel structures 330, and each of the three vertexes can be a respective dummy channel structure. In addition, each of the non-quadrilateral treads 332 can include a corresponding contact structure 328. Each of the contact structures 328 is accordingly formed on a corresponding non-quadrilateral tread 332 and extends from the corresponding non-quadrilateral tread 332 to couple to a controller or a driver, such as a decode structure.

Figure 4:
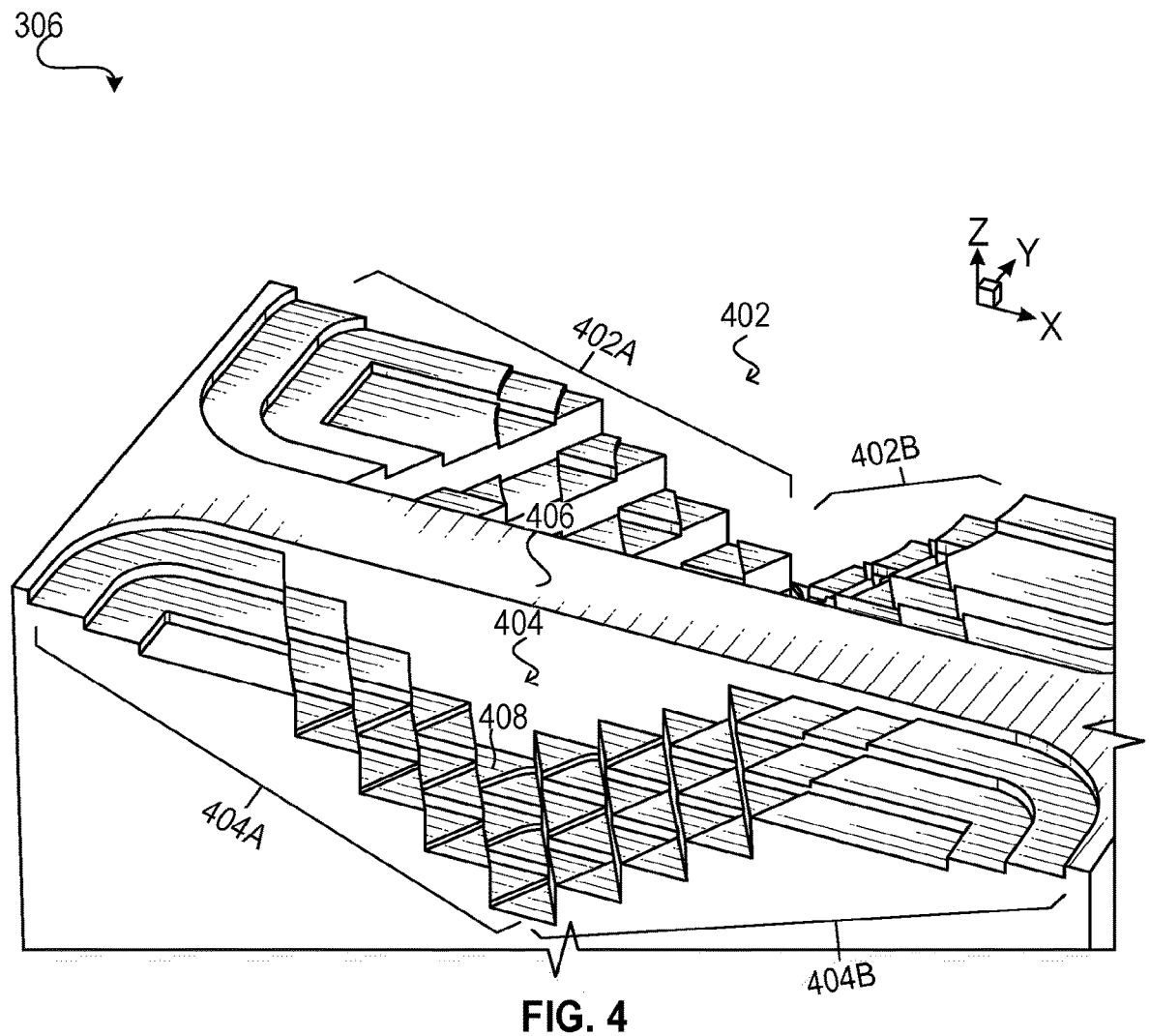
FIG. 4 is a three-dimensional view of a connection region in an exemplary 3D NAND device, in accordance with exemplary embodiments of the disclosure.

FIG. 4 is a three-dimensional view of an embodiment of the connection region 306 in the block 300. As shown in FIG. 4, the connection region 306 can have a first staircase 402 and a second staircase 404. In some embodiments, the connection region 306 includes a separation region 406 that is disposed between the first and second staircases 402 and 404. In some embodiments, the first and second staircases 402 and 406 can include a plurality of non-quadrilateral treads.

The first staircase 402 can have a first group of stairs 402A and a second group of stairs 402B. The first and second groups of stairs 402A and 402B may have the same number or different number of stairs, for example based on the number of word line layers in the stack. In an exemplary embodiment of FIG. 4, the first group of stairs 402A can have a first step-down direction (e.g., X direction), and the second group of stairs 402B can have a second step-down direction (e.g., -X direction). The first step-down direction is opposite to the second step-down direction so that the first group of stairs 402A and the second group of stairs 402B can converge at one or more shared stairs. The first and second groups of stairs 402A and 402B can further have one or more steps along a third step-down direction (e.g., Y direction) that is perpendicular to the first and second step-down directions.

Similarly, the second staircase 404 can have a third group of stairs 404A and a fourth group of stairs 404B. The third and fourth groups of stairs 404A and 404B may have the same number or different number of stairs, for example based on the number of word line layers in the stack. The third group of stairs 404A can have the first step-down direction (e.g., X direction), and the fourth group of stairs 404B can have the second step-down direction (e.g., -X direction). The third group of stairs 404A and the fourth group of stairs 404B can converge at one or more shared stairs (e.g., stair 408). The third and fourth groups of stairs 404A and 404B can have a fourth step-down direction (e.g., -Y direction) that is perpendicular to the first and second step-down directions. In some embodiments, the fourth step-down direction can be opposite to the third step-down direction.

It should be noted that FIG. 4 is merely an example, and the first and second staircases 402 and 404 can have any number of groups of stairs. In addition, each of the groups of stairs can have any number of stairs that extend in any number of step-down directions. For example, the first group of stairs 404A may extend in the first step-down direction (e.g., X direction), also extend in the fourth step-down direction (e.g., -Y direction) and the third step-down direction (e.g., Y direction) according to the device structure design.

Figure 5:
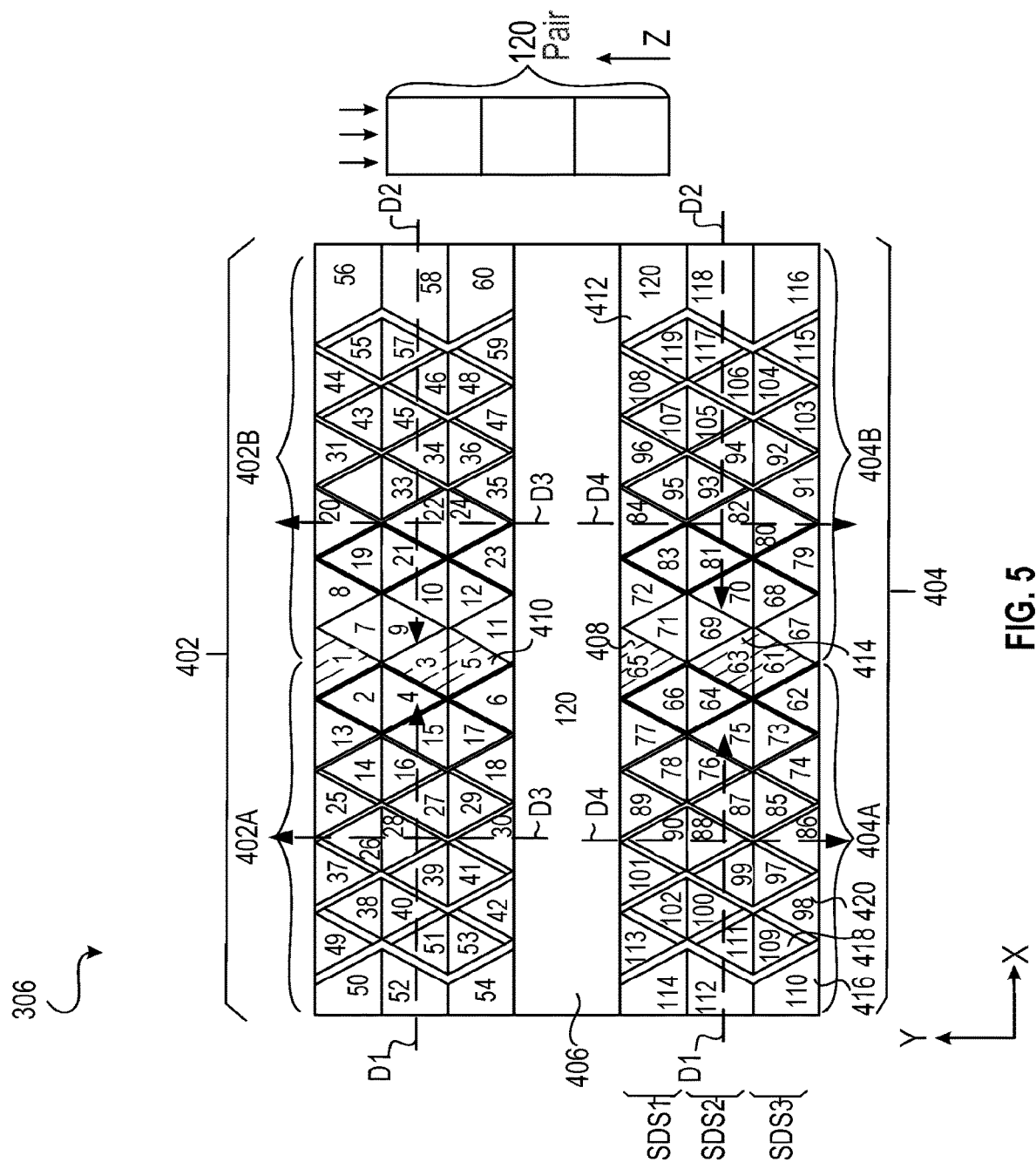
FIG. 5 is a schematic top down view of a connection region in an exemplary 3D NAND device, in accordance with exemplary embodiments of the disclosure.

FIG. 5 is schematic top down view of an embodiment of the connection region 306 in the block 300. As shown in FIG. 5, the first staircase 402 includes the first group of stairs 402A having triangular treads and extending in the first step-down direction D1 along the X direction. The first staircase 402 further includes the second group of stairs 402B having triangular treads and extending in the second step-down direction D2 along the −X direction. The first group of stairs 402A and the second group of stairs 402B converge at one or more first shared stairs, such as stairs labelled with 1, 3, and 5. The first group of stairs 402A and the second group of stairs 402B further extend in the third step-down direction D3 along the Y direction. In an exemplary embodiment of FIG. 5, each of the first and second groups of stairs can have three steps along the Y direction. Accordingly, the first staircase can have three stair divided schemes (or three divided stair regions) along the third step-down direction.

The second staircase 404 includes the third group of stairs 404A having triangular treads and extending in the first step-down direction D1 along the X direction. Further, the second staircase 404 includes the fourth group of stairs 404B having triangular treads and extending in the second step-down direction D2 along the −X direction. The third group of stairs 404A and the fourth group of stairs 404B converge at one or more first shared stairs, such as stairs labelled with 61, 63, and 65. The third group of stairs 404A and the fourth group of stairs 404B further extend in the fourth step-down direction D4 along the −Y direction. In an exemplary embodiment of FIG. 5, each of the third and fourth groups of stairs can have three steps along the −Y direction. Accordingly, the second staircase can have three stair divided schemes (or three divided stair regions) along the third step-down direction. For example, the second staircase 404 can have three stair divided schemes SDS1, SDS2, and SDS3.

In an exemplary embodiment of FIG. 5, the block 300 can include a stack with 120 pairs of word line layers and insulating layers. A top word line layer of the stack is labelled as 120 and a bottom word line layer of the stack is labelled as 1. Each stair has a numeric label that refers to a height of the stair, or a number of word line layers that the stair includes. The numeric label also refers to an exposed layer (or uppermost layer) of the word line layers in each stair. By introducing the first staircase 402 and the second staircase 404, each of the word line layers in the block 300 can be exposed to receive a corresponding contact structure (e.g., contact structures 328 in FIG. 3).

For example, the stair 408 has a numeric label 65, which means that the stair 408 includes 65 word line layers (or has a height of 65 word line layers), and a top layer that is exposed is a 65th word line layer in the stack. In some embodiments, each stair in the first staircase 402 can have a smaller height than a height of a stair in the second staircase 404 that is disposed on an opposite side of the separation region 406. For example, the stair 408 in the second staircase 402 has a larger height (e.g., 65) than a height (e.g., 5) of the stair 410 in the first staircase 402, and the stair 408 and stair 410 are disposed on two opposing sides of the separation region 406. In addition, an uppermost stair 412 in the second staircase 404 and the separation region 406 can be of a same height (e.g., 120).

A height difference between two adjacent stairs can be described based on the second staircase 404. The first staircase 402 has a similar configuration to the second staircase 404. According to FIG. 5, the second staircase 404 can have three stairs along the fourth step down direction D4 (e.g., −Y direction), and a height difference between two adjacent stairs (e.g., stair 408 and stair 414) of the three stairs can be two, that is equal to a height of two word line layers. Further, the third group of stairs 404A can have ten stairs along the first step-down direction D1 and a height difference between two adjacent stairs can be one or 11, depending on locations of the stairs. For example, a stair 416 and a stair 418 have a height difference of one, and the stair 418 and a stair 420 have a height difference of 11. Similarly, the fourth group of stairs 404B can have 11 stairs along the second step-down direction and a height difference between two adjacent stairs can be six, one, or 11, depending on locations of the stairs. The third group of stairs 404A and the fourth group of stairs 404B can converge at one or more shared stairs (e.g., 408, 414).

Figure 6:
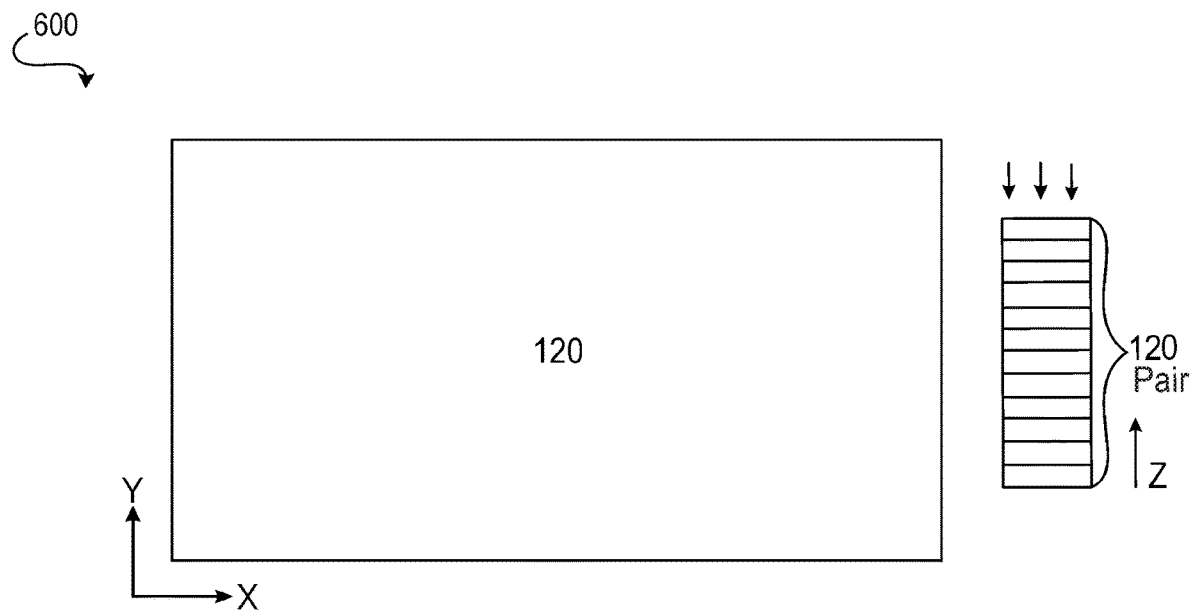
FIGS. 6, 7, 8A, 8B, 9A, 9B, 10A, 10B, 11A and 11B are top-down views of various intermediate steps of manufacturing an exemplary 3D NAND device, in accordance with exemplary embodiments of the disclosure.

FIGS. 6, 7, 8A, 8B, 9A, 9B, 10A, 10B, 11A, and 11B are first top-down views of various intermediate steps of manufacturing an exemplary 3D NAND device. In FIG. 6, a stack 600 of word line layers and insulating layers are provided. In an exemplary embodiment of FIG. 6, 120 pairs of word line layers and insulating layers are stacked alternatingly in a substrate. In some embodiments, the word line layers formed in the stack 600 can be sacrificial word line layers, and the sacrificial word line layers can be replaced with a conductive material to form word line layers in subsequent manufacturing steps. In some embodiments, the sacrificial word line layers can be made of SiN, and the insulating layers can be made of SiO. Any suitable deposition process can be applied to form the sacrificial word line layers and the insulating layers. For example, a chemical vapor deposition process, a physical vapor deposition process, a diffusion process, an atomic layer deposition process, or other suitable deposition processes can be applied.

Figure 7:
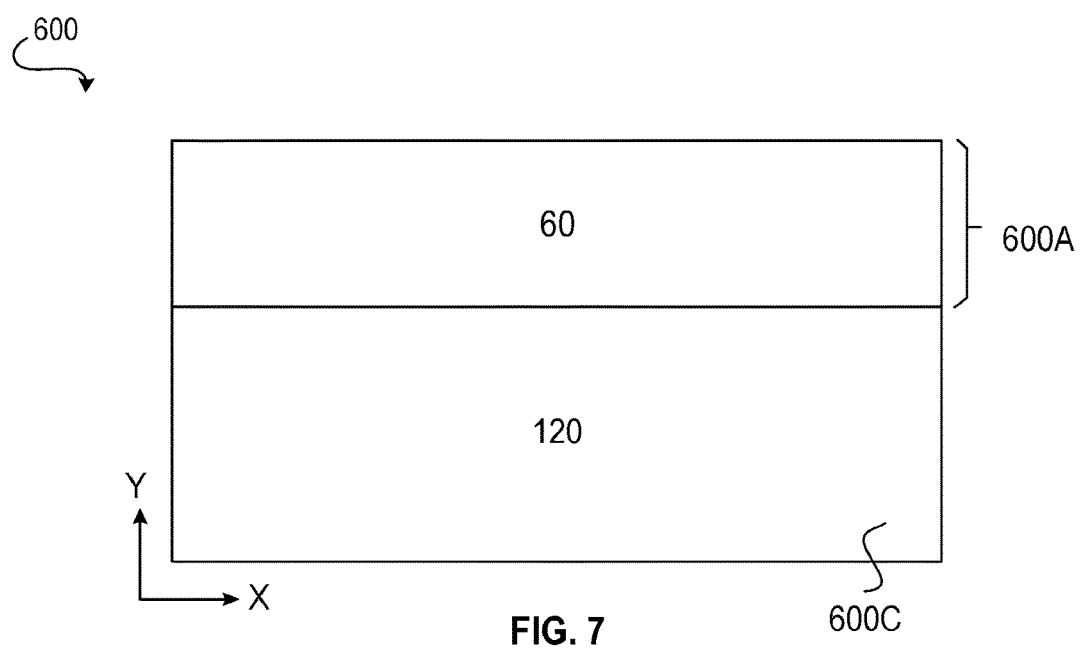

In FIG. 7, portions of one or more of the sacrificial word line layers and the insulating layers can be removed along a vertical direction (e.g., −Z direction) to define a first staircase region 600A in the stack 600. The vertical direction is perpendicular to the substrate. In order to remove the portions of the one or more sacrificial word line layers and the insulating layers in the stack 600, a combination of a photolithography process and an etching process can be applied. The photolithography process can apply a mask layer over a top surface 600C of the stack 600 to expose the first staircase region 600A and cover a remaining region of the stack. The etching process can be applied subsequently to remove the portions of the one or more sacrificial word line layers and insulating layers in the first staircase region 600A. Any number of word line layers in the first staircase region 600A can be removed according to the device structure design. In an exemplary embodiment of FIG. 7, half of the word line layers in the first staircase region 600A are removed along the vertical direction.

Figure 8A:
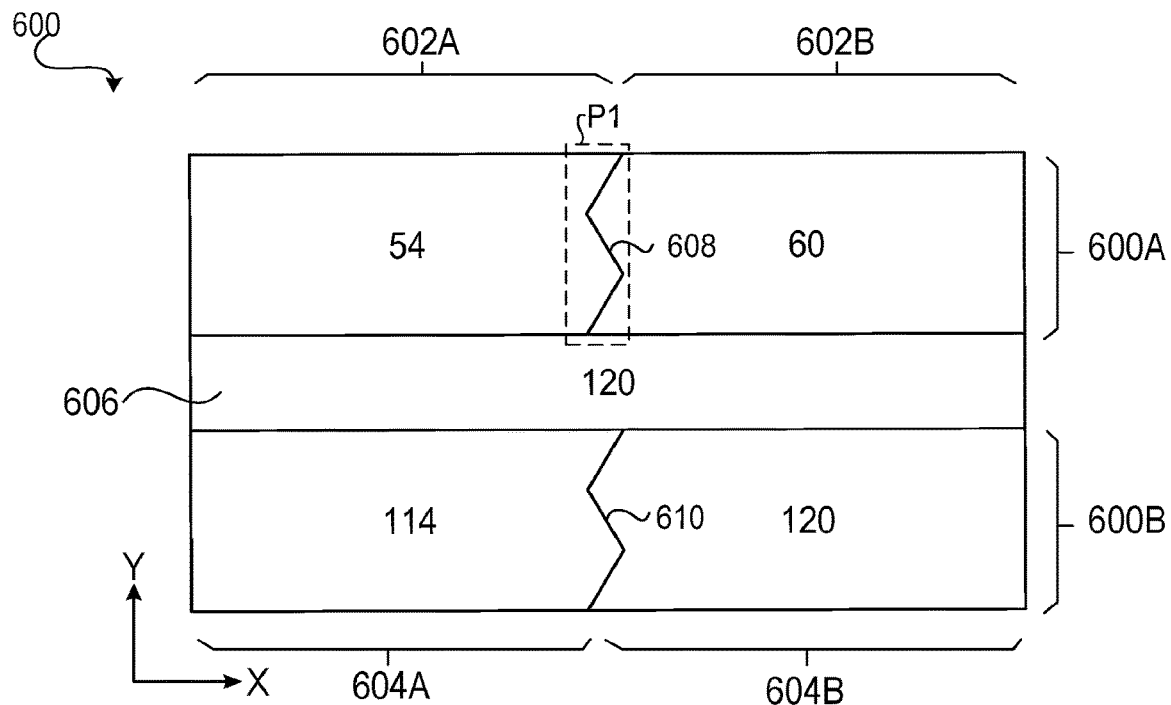

FIGS. 8A, 9A, 10A and 11A illustrate examples of forming the first and second staircases. FIGS. 8B, 9B, 10B and 11B illustrate a second example of forming the first and second staircases. In FIG. 8A, a first stair 608 can be formed in the first staircase region 600A and a second stair 610 can be formed in a second staircase region 600B of the stack 600. The sacrificial word line layers and insulating layers in the first staircase region 600A can be shaped to form the first stair 608. The first stair 608 can have a tread with a zig-zag edge profile P1 and extend in a step-down direction along a first lateral direction (e.g., −X direction) parallel to the substrate. The first stair 608 separates the sacrificial word line layers and the insulating layers in the first staircase region 600A into a first section 602A and a second section 602B. In addition, sacrificial word line layers and insulating layers in the second staircase region 600B of the stack 600 can be shaped to form the second stair 610. The second stair 610 can have a tread with the zig-zap edge profile P1 and extend in a step-down direction along a lateral direction, such as the first lateral direction, where the second stair 610 separates the sacrificial word line layers and the insulating layers in the second staircase region 600B into a third section 604A and a fourth section 604B.

Figure 8B:
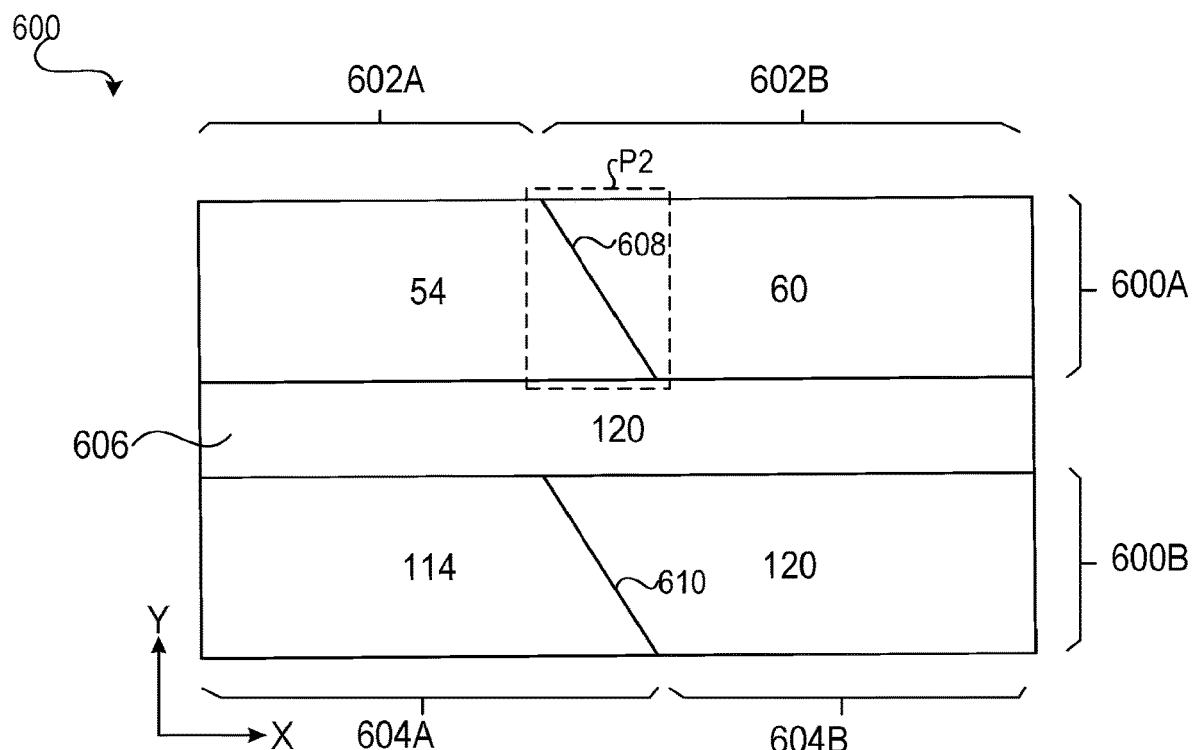

In FIG. 8B, the first stair 608 can be formed to have a tread with a slant edge profile P2 and extend in a step-down direction along the first lateral direction, and the second stair 610 can be formed to have a tread with the slant edge profile P2 and extend in a step-down direction along a lateral direction, such as the first lateral direction. When the first and second staircase regions 600A and 600B are formed, a separation region 606 can be formed as a result in the stack 600. The first and second staircase regions 600A and 600B can be separated by the separation region 606 of the stack 600.

In order to form the first and second stairs 608 and 610, a combination of a photolithography process and an etching process can be applied. The photolithography process can apply a patterned mask layer to expose the first section 602A of the first staircase region 600A and the third section 604A of the second staircase region 600B. The etching process can be applied subsequently to remove portions of one or more of the sacrificial word line layers and the insulating layers in the first section 602A of the first staircase region 600A and in the third section 604A of the second staircase region 600B, respectively. The first and second stairs 608 and 610 can be formed as a result of the completion of the etching process. In an example, the patterned mask layer can be formed by the photolithography process to generate the zig-zap edge profile P1. In another example, the patterned mask layer can be formed by the photolithography process to generate the slant edge profile P2.

Figure 9A:
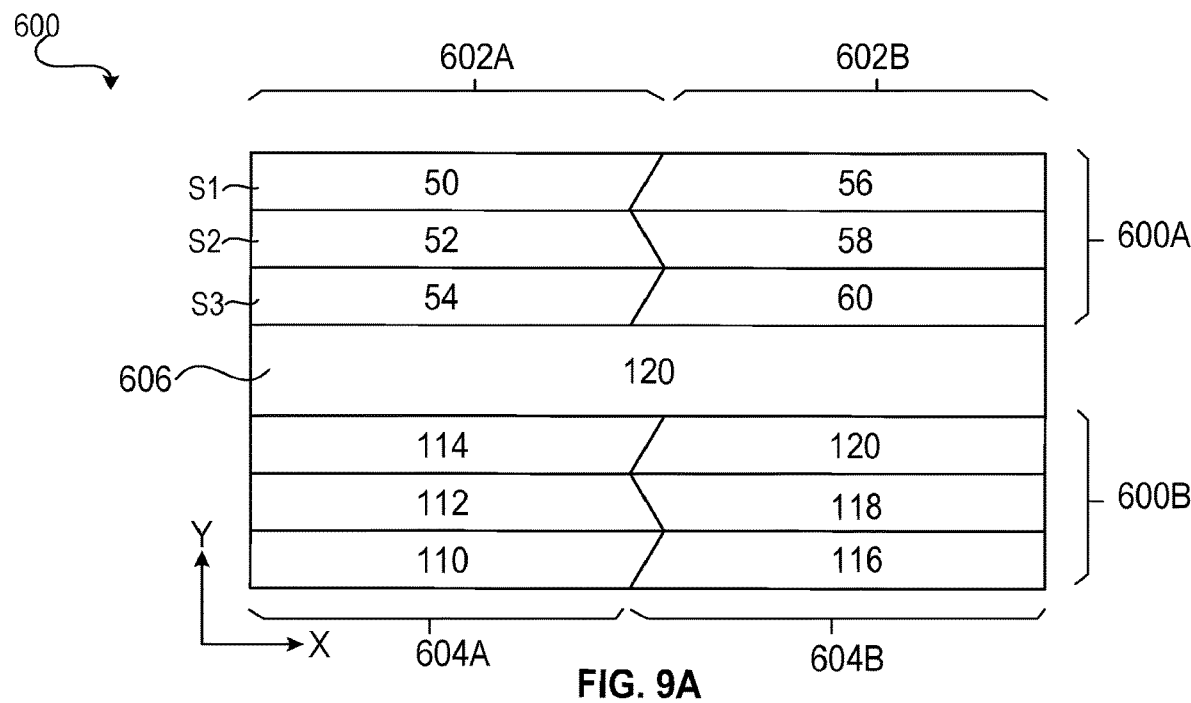
Figure 9B:
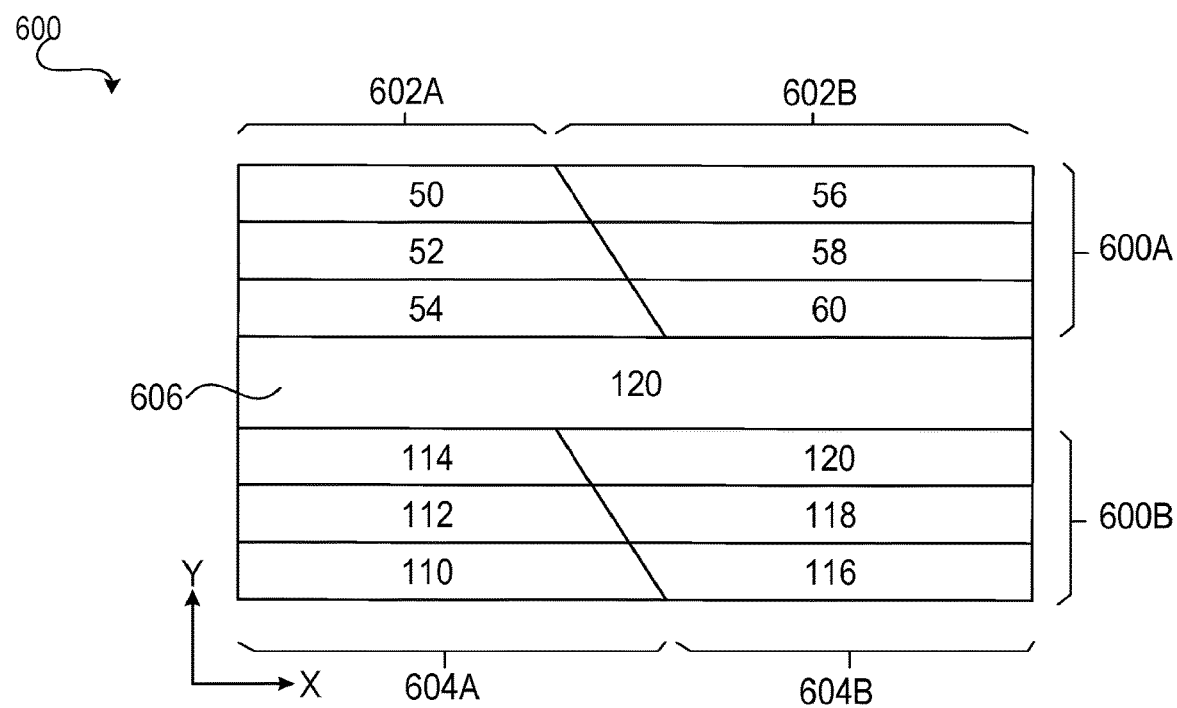

FIG. 9A illustrates a subsequent process to the process in FIG. 8A, and FIG. 9B illustrates a subsequent process to the process in FIG. 8B. In FIGS. 9A and 9B, one or more of the sacrificial word line layers and the insulating layers in the first staircase region 600A can be shaped to form one or more stairs with a step-down direction along a second lateral direction (e.g., Y direction), where the second lateral direction is perpendicular to the first lateral direction (e.g., -X direction). For example, as shown in FIGS. 9A and 9B, three stairs can be formed in the first and second sections 602A-602B of the first staircase region 600A along the Y direction. Moreover, one or more of the sacrificial word line layers and the insulating layers in the second staircase region 600B can be shaped to form one or more stairs with a step-down direction along a third lateral direction; For example, the third lateral direction (e.g., -Y direction) can be opposite to the second lateral direction. For example, three stairs can be formed in the third and fourth sections 604A and 604B of the second staircase region 600B along the third lateral direction.

In order to form the one or more stairs along the second or third lateral direction, a resist trim and an etching process can be operated alternately in the first and second staircase regions 600A and 600B respectively. For example, a resist layer can be deposited on the first section 602A of the first staircase region 600A. A photolithography process can introduce a patterned resist layer to expose a first part S1 of the first section 602A along the second lateral direction (e.g., Y direction). A plasma etching process can be applied to remove portions of one or more of the word line layers and insulating layers in the exposed first part S1. A resist trim process, such as a plasma ashing process, is thus applied to expose a second part S2 of the first section 602A along the second lateral direction, and the plasm etching process can be applied to remove portions of one or more of the word line layers and insulating layers in the exposed second part S2 and exposed first part S1. The plasma ashing process can be subsequently applied again to remove the remaining resist layer. Once the remaining resist layer is removed, three stairs are formed in the first section 602A of the first staircase region 600A along the second lateral direction (e.g., Y direction).

Figure 10A:
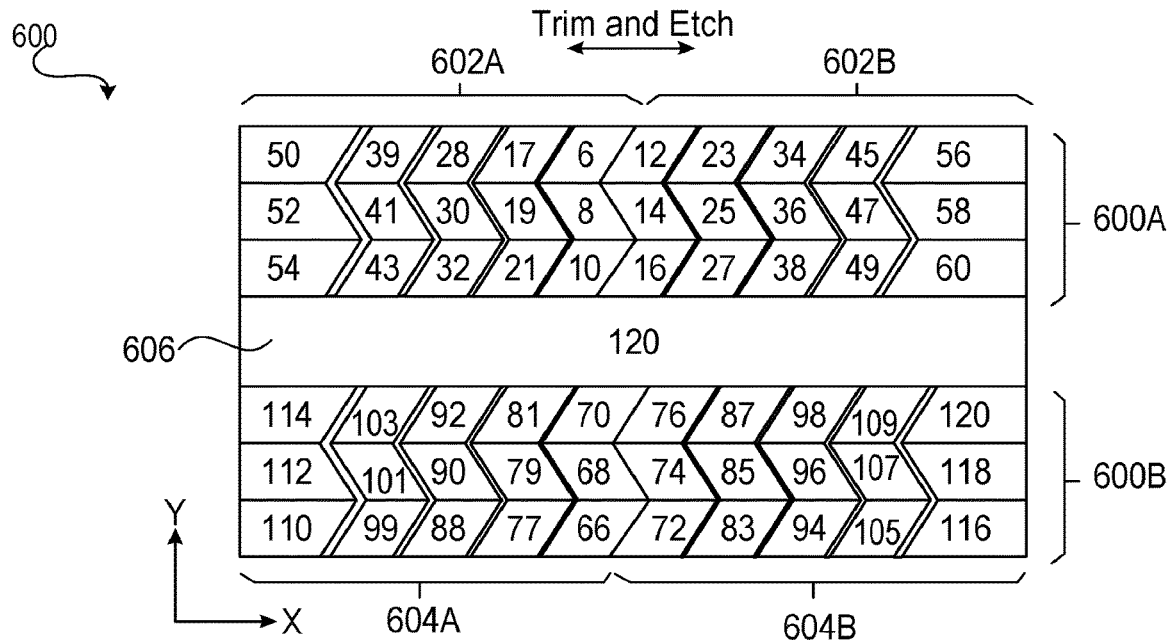
Figure 10B:
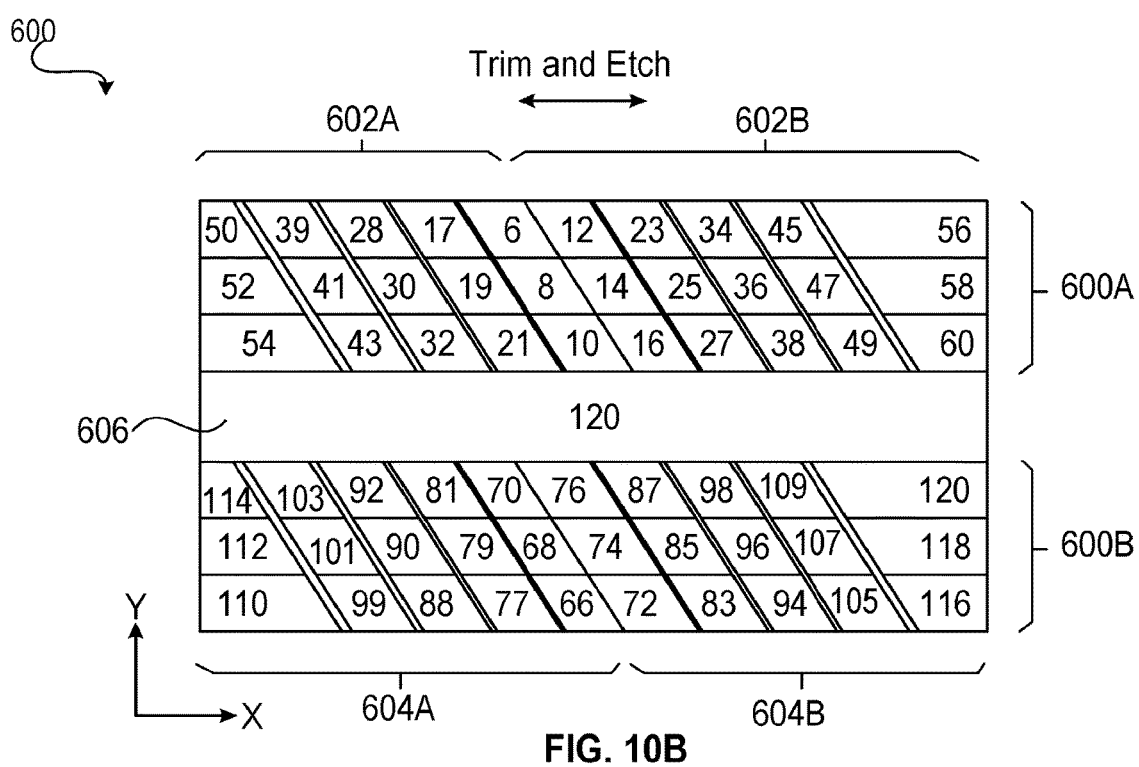

FIG. 10A illustrates a subsequent process to the process in FIG. 9A and FIG. 10B illustrates a subsequent process to the process in FIG. 9B. In FIGS. 10A and 10B, a resist trim process and an etching process can be sequentially applied on the sacrificial word line layers and the insulating layers in the first and second staircase regions 600A and 600B to form a plurality of stairs. These processes can be applied concurrently or at different times in the first and second staircase regions 600A and 600B. The stairs can have treads with the zig-zag edge profile P1 in FIG. 10A or have treads with the slant edge profile P2 in FIG. 10B according to the photolithography process. The stairs in the first section 602A can have a step-down direction along a fourth lateral direction (e.g., X direction) and the stairs in the second section 602B can have a step-down direction along the first lateral direction (-X direction). The stairs in the third section 604A can have a step-down direction along the fourth lateral direction (e.g., X direction) and the stairs in the fourth section 604B can have a step-down direction along the first lateral direction (e.g., -X direction).

Figure 11A:
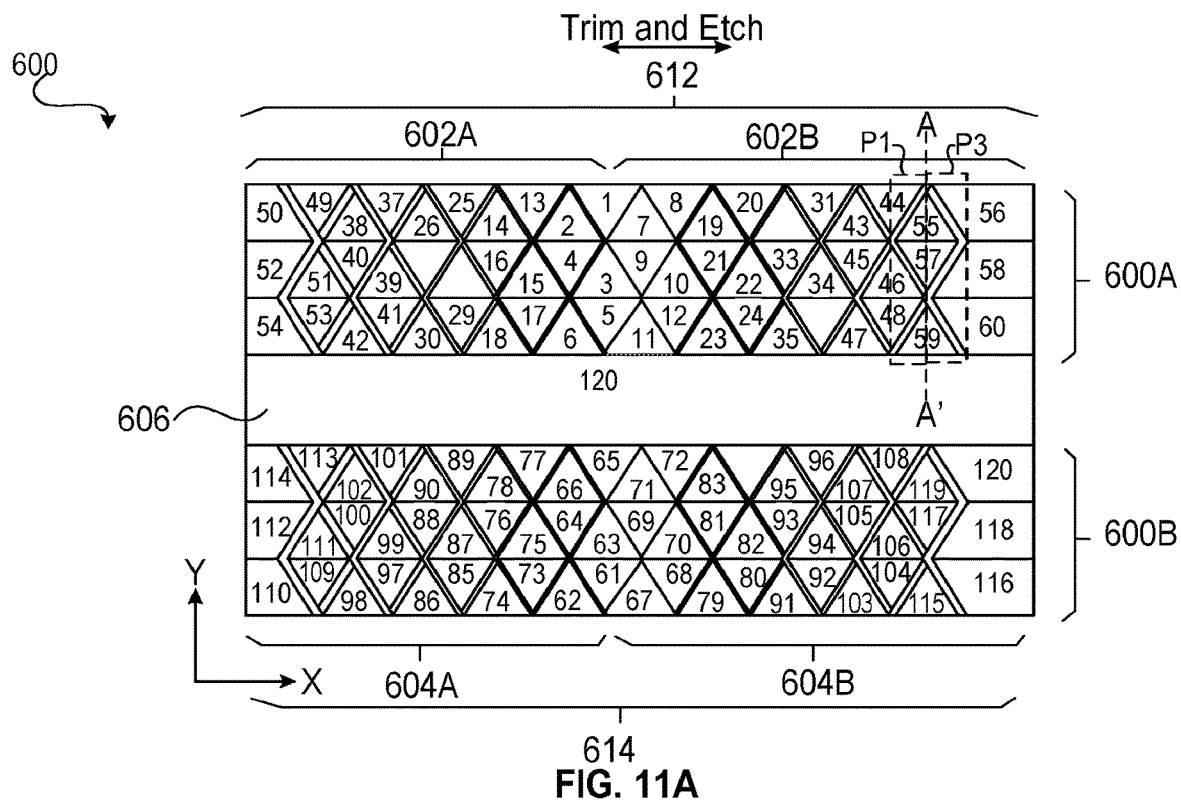
Figure 11B:
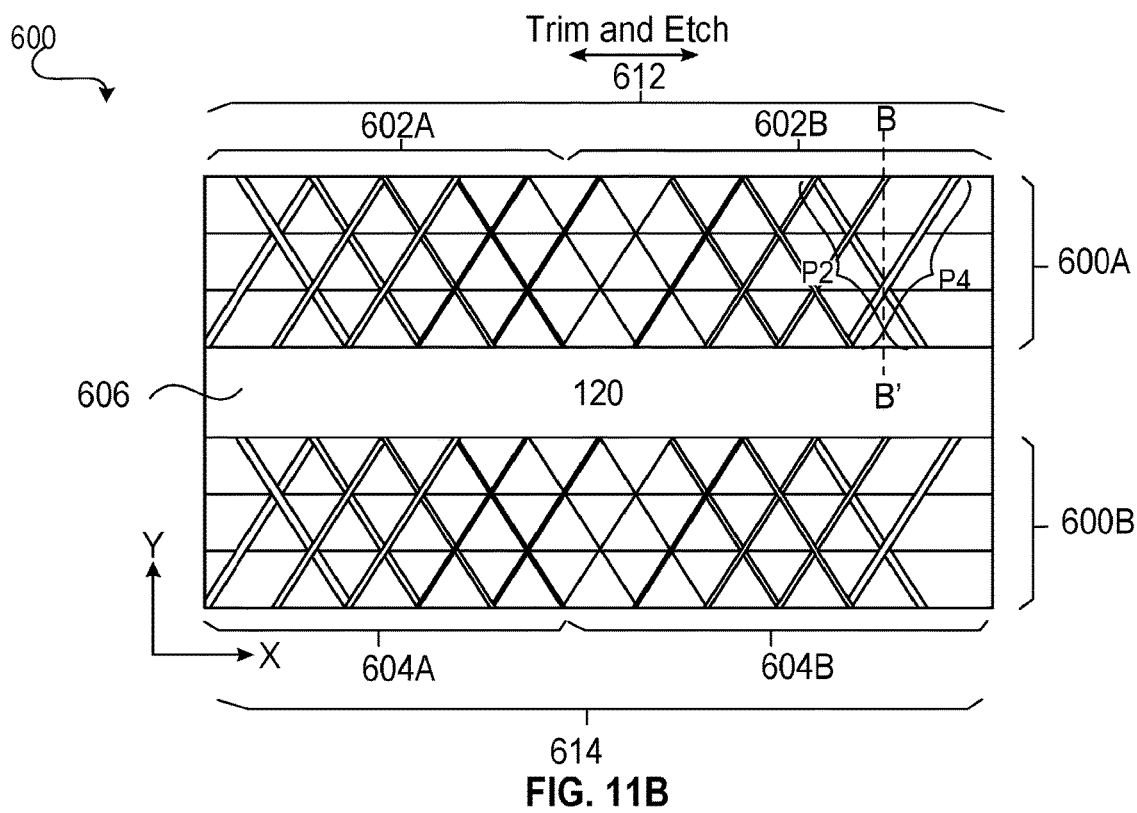

FIG. 11A illustrates a subsequent process to the process in FIG. 10A and FIG. 11B illustrates a subsequent process to the process in FIG. 10B. In FIGS. 11A and 11B, the resist trim process and the etching process can be sequentially applied on the sacrificial word line layers and the insulating layers in the first and second staircase regions 600A and 600B to form a plurality of stairs. These processes can be applied concurrently or at different times in the first and second staircase regions 600A and 600B. The stairs can have treads with a zig-zag edge profile P3 in FIG. 11A or have treads with a slant edge profile P4 in FIG. 11B according to the photolithography process. The stairs in the first section 602A can have a step-down direction along the fourth lateral direction (e.g., X direction) and the stairs in the second section 602B can have a step-down direction along the first lateral direction (-X direction). The stairs in the third section 604A can have a step-down direction along the fourth lateral direction (e.g., X direction) and the stairs in the fourth section 604B can have a step-down direction along the first lateral direction (e.g., -X direction).

In some embodiments, the zig-zag edge profile P1 and the zig-zag edge profile P3 are symmetric along a direction A-A' parallel to the second lateral direction (e.g., Y direction) or the third lateral direction (e.g., -Y direction). In some embodiments, the slant edge profile P2 and the slant edge profile P4 are symmetric along a direction B-B' parallel to the second lateral direction (e.g., Y direction) or the third lateral direction (e.g., -Y direction).

As shown in FIGS. 11A and 11B, when the resist trim process and the etching process are completed, the stack 600 can have a similar configuration to the connection region 306 in FIGS. 4 and 5.

For example, as shown in FIGS. 11A and 11B, the stack 600 can have a first staircase 612 that includes stairs having triangular treads and extending in a step-down direction along the fourth lateral direction (e.g., X direction) in the first section 602A. The first staircase 612 can also include stairs having triangular treads and extending in a step down direction along the first lateral direction (e.g., -X direction)

in the second section 602B. The first staircase 612 further can extend in a step-down direction along the second lateral direction (e.g., Y direction).

The stack 600 can have a second staircase 614 that includes stairs having triangular treads and extending in a step-down direction along the fourth lateral direction (e.g., X direction) in the third section 604A. The second staircase 614 can also include stairs having triangular treads and extending in a step down direction along the first lateral direction (e.g., −X direction) in the fourth section 604B. The second staircase 614 further can extend in a step-down direction along the third lateral direction (e.g., −Y direction). In addition, the first and second staircases 612 and 614 are separated, or spaced apart, from one another by the separation region 606.

FIGS. 12-18 are exemplary top-down views of various intermediate steps of manufacturing an exemplary 3D NAND device. Comparing to the top-down views of various intermediate steps illustrated in FIGS. 6, 7, 8A, 8B, 9A, 9B, 10A, 10B, 11A, and 11B, a photolithography-etch process (also referred to as photo-etch process) rather than a resist trim-etch process can be repetitively applied in order to form stairs with non-quadrilateral treads. In some embodiments, the photolithography-etch process can improve the edge profile of the treads.

Figure 12:
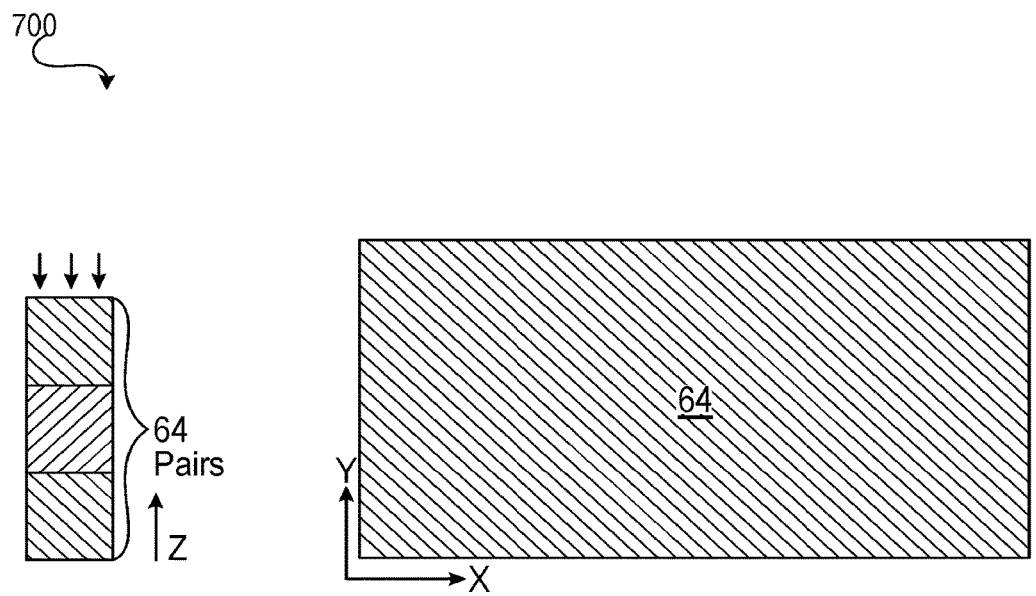
FIGS. 12 through 18 are top-down views of various intermediate steps of manufacturing an exemplary 3D NAND device, in accordance with exemplary embodiments of the disclosure.
Figure 13:
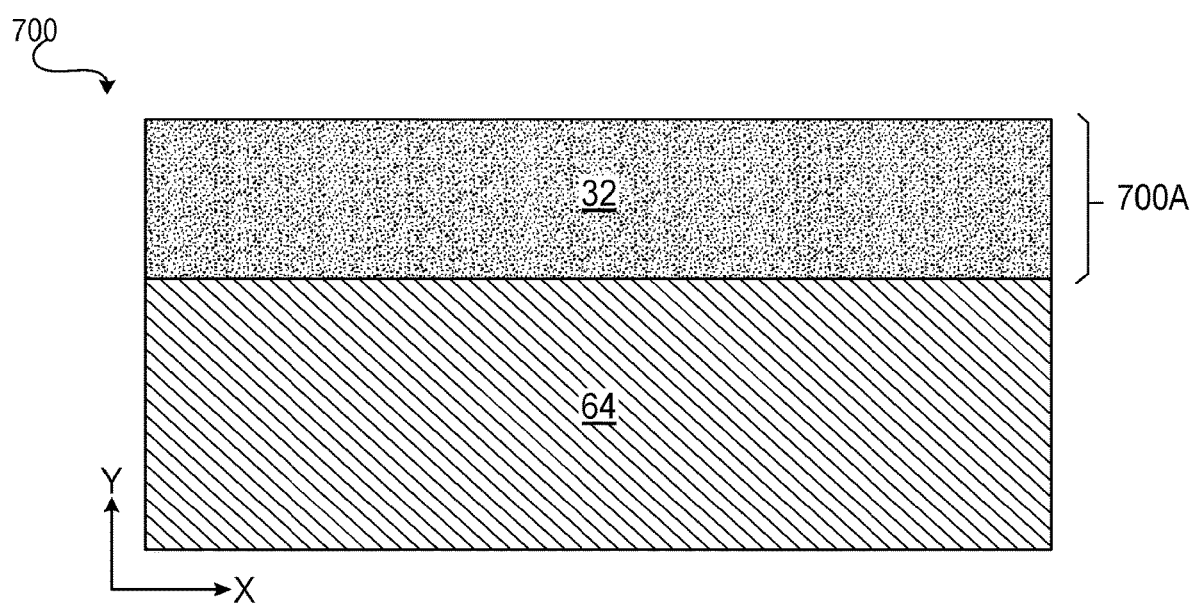

In FIG. 12, a stack 700 can be formed over a substrate. The stack 700 can include 64 pairs of sacrificial word line layers and insulating layers that are stacked alternatingly in the substrate. In FIG. 13, a first staircase region 700A can be formed in the stack 700 where the top 32 pairs of the sacrificial word line layers and the insulating layers are removed in the first staircase region 700A through a patterning process, such as a photolithography-etch process.

Figure 14:
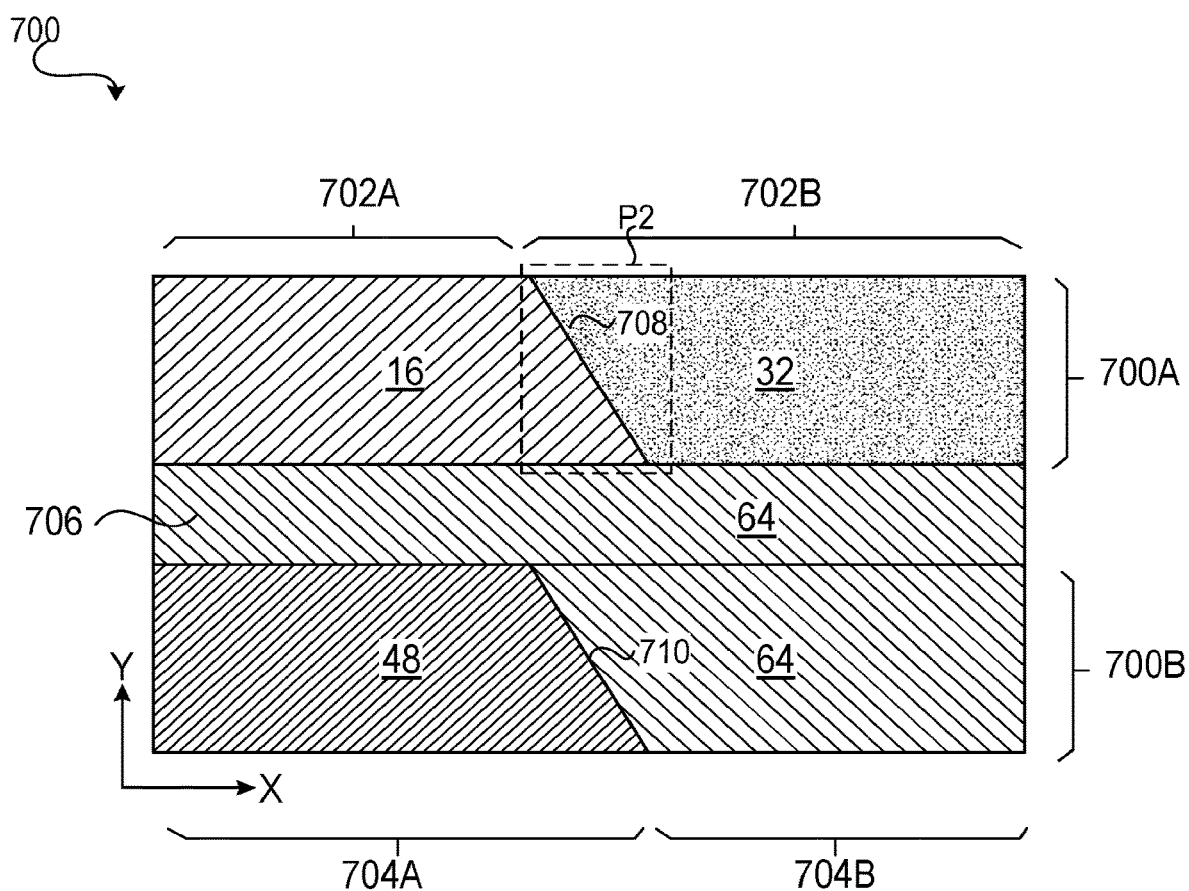

In FIG. 14, a combination of a photolithography process and an etching process can be applied to form a first stair 708 in the first staircase region 700A and a second stair 710 in the second staircase region 700B. The first stair 708 can have a tread with a slant edge profile, such as the slant edge profile P2, and divide the first staircase region 700A into a first section 702A and a second section 702B. The first stair 708 can have a step-down direction along the −X direction. The second stair 710 can have a tread with the slant edge profile P2 and divide the second staircase region 700B into a third section 704A and a fourth section 704B. The second stair 710 can have a step-down direction along the −X direction.

Figure 15:
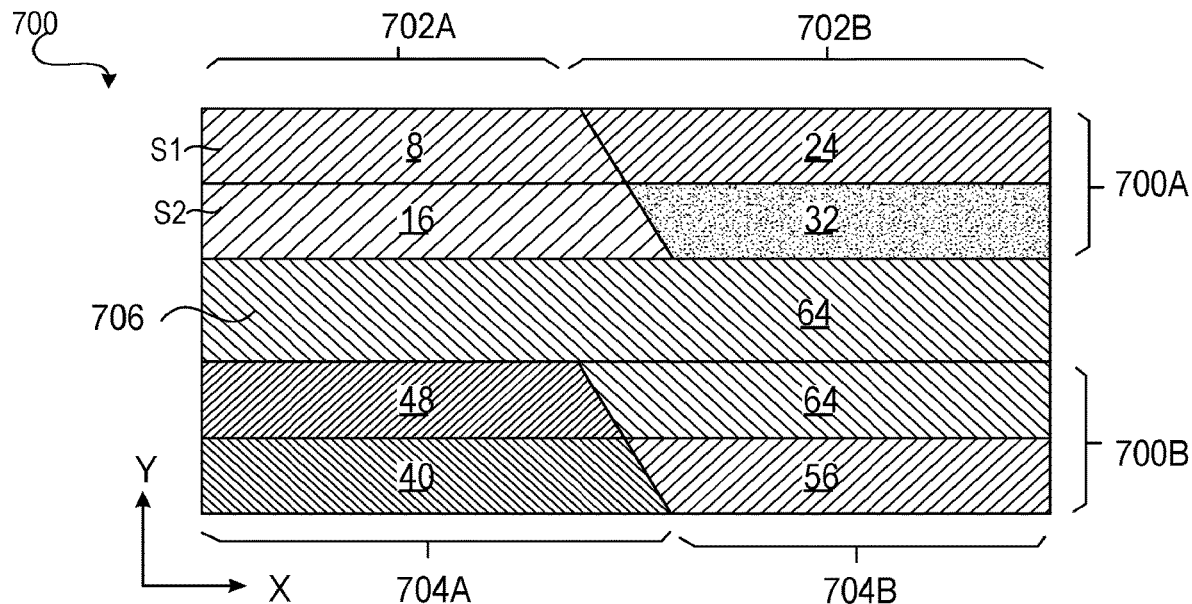

In FIG. 15, a photolithography process and an etching process can be applied sequentially to form a plurality of stairs (e.g., two stairs), in the first staircase region 700A, where the stairs extend in a step-down direction along the Y direction. The photolithography process and the etching process can further be applied sequentially to form a plurality of stairs (e.g., two stairs), in the second staircase region 700B, where the stairs extend in a step-down direction along the −Y direction. In order to form the stairs along the Y or −Y direction, an exemplary embodiment can be provided according to the stairs formed in the first section 702A. As shown in FIG. 15, a patterned mask can be applied to cover a first part S1 of the first section 702A through the photolithography process, and the etching process can remove one or more of the sacrificial word line layers and the insulating layers in a second part S2. Further, a patterned mask can be applied to cover the second part S2 of the first section 702A through the photolithography process and the etching process can remove one or more of the sacrificial word line layers and the insulating layers in the first part S1.

Figure 16:
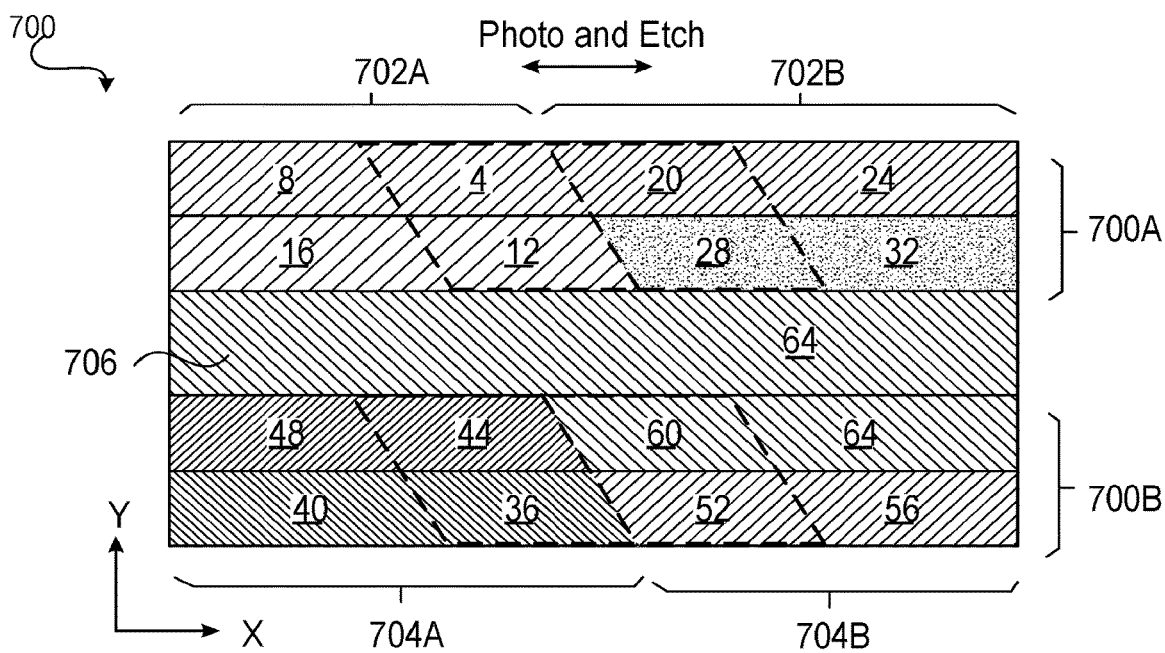
Figure 17:
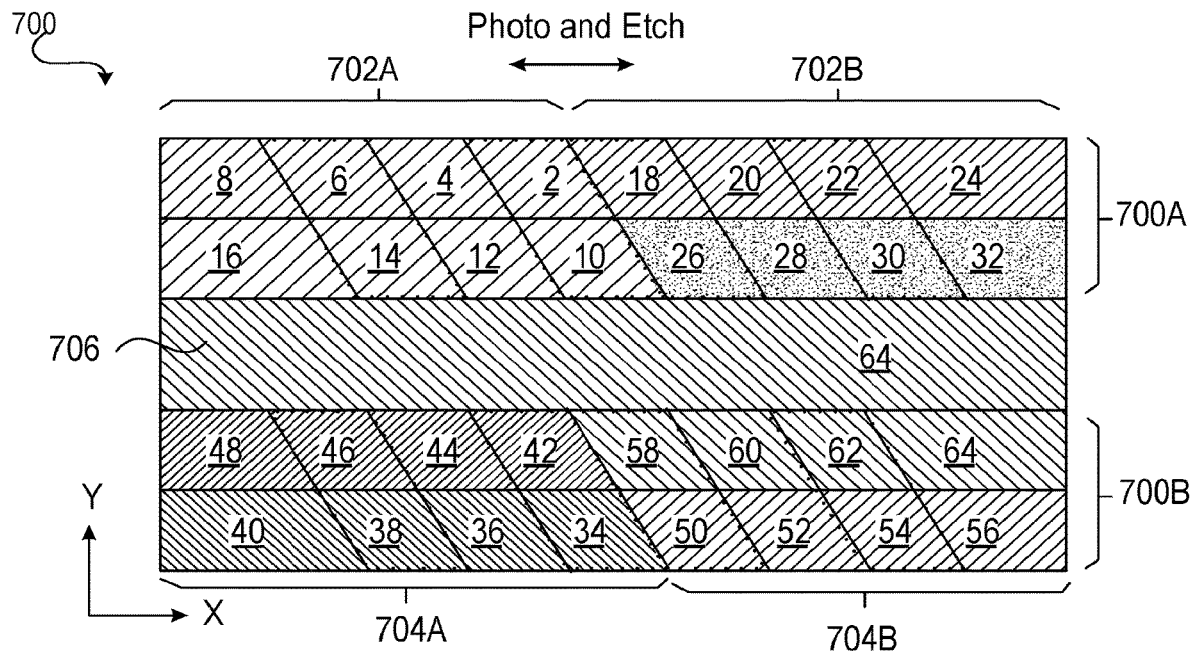

In FIG. 16, the first staircase region 700A and the second staircase region 700B can be divided into four sub-sections by applying the photolithography process and the etching process sequentially to form more stairs that have treads with the slant edge profile P2. For example, four stairs can be formed in the first section 702A. The four stairs in the first section 702A can have treads with the slant edge profile P2 and extend in the X direction. Similarly, four stairs can be formed in the second section 702B. The four stairs in the second section 702B can have treads with the slant edge profile P2 and extend in the −X direction In FIG. 17, the first staircase region 700A and the second staircase region 700B can be divided further into eight sub-sections by applying the photolithography process and the etching process sequentially to form more stairs. For example, eight stairs can be formed in the first section 702A. The eight stairs in the first section 702A can have treads with the slant edge profile P2 and extend in the X direction. Similarly, eight stairs can be formed in the second section 702B. The eight stairs in the second section 702B can have treads with the slant edge profile P2 and extend in the −X direction.

Figure 18:
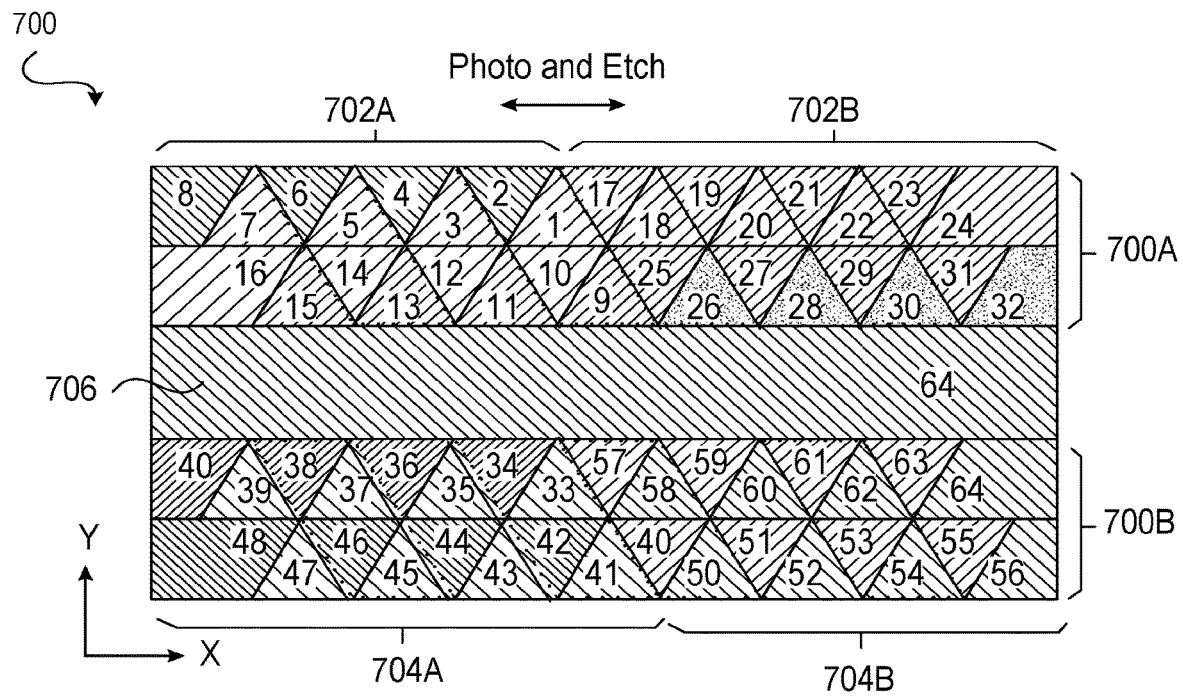

In FIG. 18, the photolithography process and the etching process can be sequentially applied on the sacrificial word line layers and the insulating layers in the first and second staircase regions 700A and 700B to form a plurality of stairs that have treads with a slant edge profile, such as the slant edge profile P4. The stairs in the first section 702A can have a step-down direction along the X direction and the stairs in the second section 702B can have a step-down direction along the −X direction. The stairs in the third section 704A can have a step-down direction along the X direction and the stairs in the fourth section 704B can have a step-down direction along the −X direction. When the photolithography process and the etching process are completed, the stack 700 can have a similar configuration to the connection region 306 in FIGS. 4 and 5 that includes a plurality of stair having non-quadrilateral treads.

Figure 19:
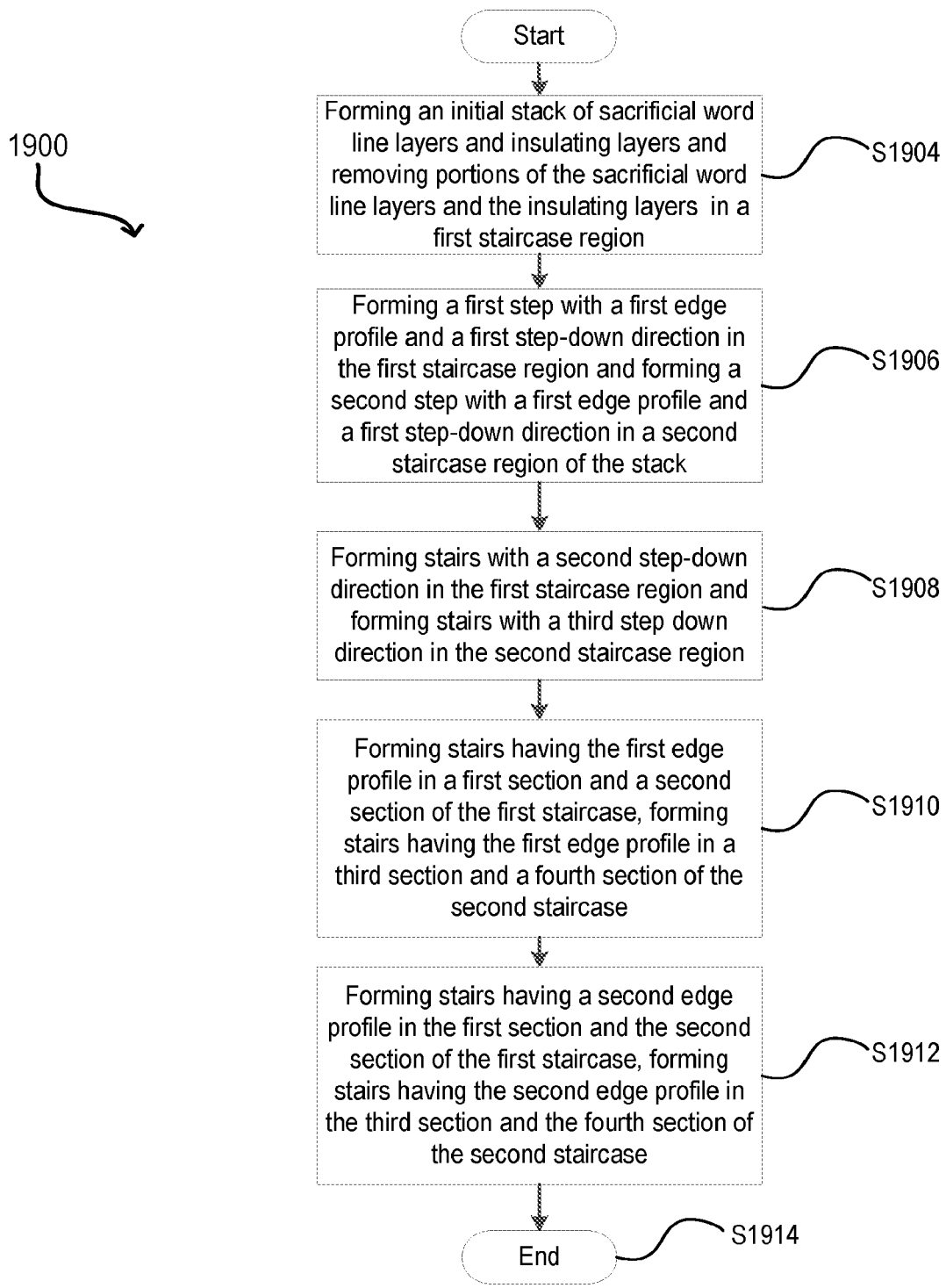
FIG. 19 is a flowchart of a process for manufacturing an exemplary 3D NAND device, in accordance with exemplary embodiments of the disclosure.

FIG. 19 is a flowchart of a process 1900 for manufacturing the disclosed 3D NAND device in accordance with some embodiments of the present disclosure. The process 1900 begins at step S1904 where an initial stack of sacrificial word line layers and insulating layers can be formed over a substrate of the 3D NAND device. Subsequently, portions of one or more of the sacrificial word line layers and the insulating layers can be removed along a vertical direction in a first staircase region of a connection region of the initial stack. The connection region is positioned between array regions (e.g., two array regions) of the initial stack. The connection region is, for example, disposed at two opposing sides of the initial stack. In some embodiments, step S1104 can be performed as illustrated with reference to FIGS. 6 and 7.

The process 1900 then proceeds to step S1906 where one or more of the sacrificial word line layers and the insulating layers in the first staircase region can be shaped, or removed, to form a first stair. The first stair can have a tread with a first edge profile and extend in a step-down direction along a first lateral direction (e.g., −X direction). The first stair separates the sacrificial word line layers and the insulating layers in the first staircase region into a first section and a second section. Further, one or more sacrificial word line layers and insulating layers can be shaped, or removed, in a second staircase region of the connection region to form a second stair. The second stair can have a tread with an edge profile, such as the first edge profile, and extend in a step-down direction along a lateral direction, such as the first lateral direction. The second stair separates the sacrificial word line layers and the insulating layers in the second staircase region into a third section and a fourth section. The first and second staircase regions can further be separated by a separation region of the connection region. In some embodiments, the first stair can be formed before the second stair. In some embodiments, the second stair can be formed before the first stair. In some embodiments, the first and second stairs can be formed concurrently. In some embodiments, the step S1906 can be performed as illustrated with reference to FIGS. 8A and 8B.

In step S1908 of the process 1900, one or more of the sacrificial word line layers and the insulating layers in the first staircase region can be shaped to form one or more stairs with a step-down direction (e.g., second step down direction) along a second lateral direction (e.g., Y direction). The second lateral direction is, for example, perpendicular to the first lateral direction (e.g., −X direction). Further, one or more of the sacrificial word line layers and the insulating layers in the second staircase region can be shaped to form one or more stairs with a step-down direction (e.g., a third step down direction) along a third lateral direction (e.g., −Y direction). The third lateral direction is, for example, opposite to the second lateral direction. In some embodiments, the steps S1908 can be performed as illustrated with reference to FIGS. 9A and 9B.

The process 1900 then proceeds to step S1910 where a patterning process, such as a resist trim-etching process, or a photolithography-etch process can be operated repetitively on the sacrificial word line layers and the insulating layers in the first and second staircase regions to form stairs having treads with the first edge profile in the first section and extending in a step-down direction along a fourth lateral direction (e.g., X direction), and stairs having tread with the first edge profile in the second section and extending in a step-down direction along the first lateral direction (e.g., −X direction), where the fourth lateral direction is for example opposite to the first lateral direction. Further, the patterning process can be operated repetitively on the sacrificial word line layers and the insulating layers in the second staircase region to form stairs having treads with the first edge profile in the third section and extending in a step-down direction along the fourth lateral direction (e.g., X direction), and stairs having treads with the first edge profile in the fourth section and extending in a step-down direction along the first lateral direction (e.g., −X direction). In some embodiments, the step S1910 can be performed as illustrated with reference to FIGS. 10A-10B.

In step S1912 of the process 1900, the patterning process, such as a resist trim-etch process, or a photolithography-etch process can be operated repetitively on the sacrificial word line layers and the insulating layers in the first and second staircase regions to form stairs having treads with a second edge profile in the first section and extending in a fourth lateral direction (e.g., X direction), and stairs having tread with the second edge profile in the second section and extending in a step-down direction along the first lateral direction (e.g., −X direction). Further, the patterning process can be operated repetitively on the sacrificial word line layers and the insulating layers in the second staircase region to form stairs having treads with the second edge profile in the third section and extending in a step-down direction along the fourth lateral direction (e.g., X direction), and stairs having treads with the second edge profile in the fourth section and extending in a step-down direction along the first lateral direction (e.g., −X direction). In some embodiments, the first edge profile and the second edge profile are symmetric. In some embodiments, the first edge profile is a zig-zag edge profile or a slant edge profile. In some embodiments, the step S1912 can be performed as illustrated with reference to FIGS. 11A-11B.

It should be noted that additional steps can be provided before, during, and after the process 1900, and some of the steps described can be replaced, eliminated, or performed in a different order or separately in other embodiments of the process 1900. For example, in subsequent process steps, channel structures can be formed in the array regions of the initial stack. The channel structures can extend from the substrate and extend through the sacrificial word line layers and the insulating layers in the array regions of the initial stack. The sacrificial word line layers then can be replaced with a conductive material to form word line layers. Further, first contact structures can be formed on the first staircase, and second contact structures can be formed on the second staircase. The first contact structures can be connected to the word line layers in the first staircase, and the second contact structures can be connected to the word line layers in the second staircase.

Moreover, various additional interconnect structures (e.g., metallization layers having conductive lines and/or vias) may be formed over the 3D NAND device. Such interconnect structures electrically connect the 3D NAND device with other contact structures and/or active devices to form functional circuits. Additional device features such as passivation layers, input/output structures, and the like may also be formed.

The various embodiments described herein can offer several advantages over related memory devices. For example, in the disclosed 3D NAND device, a connection region is arranged between array regions of the 3D NAND device, where the array regions can be formed at two opposing sides of the 3D NAND device. The disclosed connection region can have one or more staircases. The one or more staircases can further have two or more step-down directions. The disclosed connection region can not only enhance word line controls but also simplify a manufacturing process and minimize a mask request by combining a chop process and a stair divided scheme during the manufacturing process. In addition, the stair-cased connection region includes stairs with non-quadrilateral treads, which can improve the density of the contact structures that are formed on the stairs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a stack of word line layers and insulating layers that are stacked alternatingly over the substrate; and
   channel structures formed in a first array region and a second array region of the stack, the first and second array regions being positioned at two opposing sides of the stack, wherein a first staircase is formed in a connection region of the stack that is arranged between the first array region and the second array region, the first staircase having non-quadrilateral treads, a second staircase is formed in the connection region of the stack, the second staircase having non-quadrilateral treads, and the connection region in the stack includes a separation region positioned between the first and second staircases.

2. The semiconductor device of claim 1, wherein the non-quadrilateral treads are triangular.

3. The semiconductor device of claim 1, wherein the first staircase includes first stairs with a first step-down direction (X direction), and second stairs with a second step-down direction (−X direction), the first step-down direction being opposite to the second step-down direction, and the first stairs and the second stairs converge at a first shared stair.

4. The semiconductor device of claim 3, wherein the first stairs and the second stairs further have a third step-down direction (Y direction).

5. The semiconductor device of claim 4, wherein the second staircase has third stairs with the first step-down direction, and fourth stairs with the second step-down direction, and the third stairs and the fourth stairs converge at a second shared stair.

6. The semiconductor device of claim 5, wherein the third stairs and the fourth stairs further have a fourth step-down direction (−Y direction) that is opposite to the third step-down direction.

7. The semiconductor device of claim 1, wherein each stair in the first staircase has a smaller height than a height of a stair in the second staircase on an opposite side of the separation region.

8. The semiconductor device of claim 1, wherein an uppermost stair in the second staircase and the separation region are of a same height.

9. The semiconductor device of claim 1, further comprising:

first contact structures formed on the first staircase and connected to the word line layers in the first staircase; and second contact structures formed on the second staircase and connected to the word line layers in the second staircase.

10. A method for fabricating a semiconductor device, comprising:

forming an initial stack of sacrificial word line layers and insulating layers that are arranged alternately over a substrate of the semiconductor device;

forming a first staircase in a first staircase region of a connection region of the initial stack, the first staircase having non-quadrilateral treads; and forming a second staircase in a second staircase region of the connection region of the initial stack, the second staircase having non-quadrilateral treads, wherein the connection region of the initial stack includes a separation region between the first staircase and the second staircase, and the connection region is positioned between two array regions at opposing sides of the initial stack.

11. The method of claim 10, wherein the forming the first staircase in the first staircase region of the connection region comprises:

removing one or more of the sacrificial word line layers and the insulating layers in the first staircase region of the connection region;

shaping at least one of the sacrificial word line layers and the insulating layers in the first staircase region to form a first stair, the first stair having a tread with a first edge profile and a first step-down direction (−X direction), the first stair dividing the first staircase region into a first section and a second section;

shaping at least one of the sacrificial word line layers and the insulating layers in the first staircase region to form stairs with a second step-down direction (Y direction); and performing a first patterning process repetitively on the sacrificial word line layers and the insulating layers in the first staircase region to form the first staircase.

12. The method of claim 11, wherein the forming the second staircase in the second staircase region of the connection region comprises shaping at least one of the sacrificial word line layers and the insulating layers in the second staircase region of the connection region to form a second stair, the second stair having a tread with the first edge profile and the first step-down direction, the second stair dividing the second staircase region into a third section and a fourth section;

shaping at least one of the sacrificial word line layers and the insulating layers in the second staircase region to form one or more stairs with a third step-down direction (−Y direction) that is opposite to the second step-down direction; and performing a second patterning process repetitively on the sacrificial word line layers and the insulating layers in the second staircase region to form the second staircase in the second staircase region.

13. The method of claim 12, wherein the performing the first patterning process comprises:

performing the first patterning process repetitively on the sacrificial word line layers and the insulating layers in the first staircase region to form stairs having treads with the first edge profile in the first section and extending in a fourth step-down direction (X direction), and stairs having treads with the first edge profile in the second section and extending in the first step-down direction (−X direction), the fourth step-down direction being opposite to the first step-down direction; and performing the first patterning process repetitively on the sacrificial word line layers and the insulating layers in the first staircase region to form stairs having treads with a second edge profile in the first section and extending in the fourth step-down direction, and stairs having treads with the second edge profile in the second section and extending in the first step-down direction (−X direction), the first edge profile and the second edge profile being symmetric.

14. The method of claim 13, wherein the performing the second patterning process comprises:

performing the second patterning process repetitively on the sacrificial word line layers and the insulating layers in the second staircase region to form stairs having treads with the first edge profile in the third section and extending in the fourth step-down direction (X direction), and stairs having treads with the first edge profile in the fourth section and extending in the first step-down direction (−X direction); and performing the second patterning process repetitively on the sacrificial word line layers and the insulating layers in the second staircase region to form stairs having treads with the second edge profile in the third section and extending in the fourth step-down direction (X direction), and stairs having treads with the second edge profile in the fourth section and extending in the first step-down direction (−X direction), the first edge profile and the second edge profile being symmetric.

15. The method of claim 14, wherein the first edge profile and the second edge profile are symmetric along a direction parallel to the second step-down direction or the third step-down direction.

16. The method of claim 14, wherein the first edge profile is a zig-zag edge profile or a slant edge profile.

17. A semiconductor device, comprising:
a stack of word line layers and insulating layers that are stacked alternatingly over a substrate;
a first array region and a second array region formed in the stack and further positioned at two opposing sides of the stack;
one or more slit structures formed in the first array region and the second array region, the one or more slit structures extending from the substrate and further extending through the stack to separate the first array region and the second array region into sub-first array regions and sub-second array regions respectively; and
a connection region formed in the stack and positioned between the first array region and the second array region, wherein:
a first staircase is formed in the connection region of the stack that is arranged between the first array region and the second array region, the first staircase having non-quadrilateral treads;
a second staircase is formed in the connection region of the stack, the second staircase having non-quadrilateral treads; and
the connection region in the stack includes a separation region positioned between the first and second staircases.

18. The semiconductor device of claim 17, further comprising:
channel structures formed in the first array region and the second array region of the stack;
one or more dummy slit structures formed in the separation region of the connect region;
dummy channel structures formed in the first staircase and the second staircase; and
contact structures formed on the first staircase and the second staircase, the contact structures being positioned on the word line layers in the first staircase and the second staircase, wherein:
a non-quadrilateral tread of the non-quadrilateral treads has a triangular shape that includes three vertexes, each of the three vertexes being positioned at a respective dummy channel structure, a contact structure of the contact structures being positioned on the non-quadrilateral tread.

19. The semiconductor device of claim 18, wherein:
the first staircase includes first stairs with a first step-down direction (X direction), and second stairs with a second step-down direction (−X direction), the first step-down direction being opposite to the second step-down direction, the first stairs and the second stairs converging at a first shared stair, the first stairs and the second stairs further having a third step-down direction (Y direction); and
the second staircase has third stairs with the first step-down direction, and fourth stairs with the second step-down direction, the third stairs and the fourth stairs converging at a second shared stair, the third stairs and the fourth stairs further having a fourth step-down direction (−Y direction) that is opposite to the third step-down direction.

20. The semiconductor device of claim 19, wherein:
each stair in the first staircase has a smaller height than a height of a stair in the second staircase on an opposite side of the separation region; and
an uppermost stair in the second staircase and the separation region are of a same height.

* * * * *